(12) United States Patent
Rubel

(10) Patent No.: US 7,944,113 B2
(45) Date of Patent: May 17, 2011

(54) HYSTERETIC MEMS THERMAL DEVICE AND METHOD OF MANUFACTURE

(75) Inventor: Paul J. Rubel, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 336 days.

(21) Appl. No.: 12/318,634

(22) Filed: Jan. 5, 2009

(65) Prior Publication Data

US 2009/0201119 A1    Aug. 13, 2009

Related U.S. Application Data

(63) Continuation-in-part of application No. 11/705,738, filed on Feb. 14, 2007, now Pat. No. 7,626,311, which is a continuation-in-part of application No. 11/334,438, filed on Jan. 19, 2006, now Pat. No. 7,548,145.

(51) Int. Cl.
*H01L 41/08* (2006.01)

(52) U.S. Cl. ........................ 310/307; 310/309

(58) Field of Classification Search .................. 310/306, 310/307, 309; 335/78
See application file for complete search history.

(56) References Cited

U.S. PATENT DOCUMENTS

| | | | | |
|---|---|---|---|---|
| 5,962,949 A | * | 10/1999 | Dhuler et al. | 310/307 |
| 6,360,539 B1 | * | 3/2002 | Hill et al. | 60/528 |
| 6,407,478 B1 | * | 6/2002 | Wood et al. | 310/307 |
| 6,617,185 B1 | * | 9/2003 | Geisberger | 438/24 |
| 2002/0021053 A1 | | 2/2002 | Wood et al. | |
| 2003/0024243 A1 | | 2/2003 | Gianchandani et al. | |
| 2004/0166602 A1 | | 8/2004 | Wang et al. | |
| 2004/0211178 A1 | | 10/2004 | Menard et al. | |
| 2004/0261412 A1 | | 12/2004 | Hickey | |
| 2005/0146404 A1 | | 7/2005 | Yeatman | |

* cited by examiner

*Primary Examiner* — Mark Budd
(74) *Attorney, Agent, or Firm* — Jaquelin K. Spong

(57) ABSTRACT

A MEMS hysteretic thermal actuator may have a plurality of beams disposed over a heating element formed on the surface of the substrate. The plurality of beams may be coupled to a passive beam which is not disposed over the heating element. One of the plurality of beams may be formed in a first plane parallel to the substrate, whereas another of the plurality of beams may be formed in a second plane closer to the surface of the substrate. When the heating element is activated, it heats the plurality of beams such that they move the passive beam in a trajectory that is neither parallel to nor perpendicular to the surface of the substrate. When the beams are cooled, they may move in a different trajectory, approaching the substrate before moving laterally across it to their initial positions. By providing one electrical contact on the distal end of the passive beam and another stationary electrical contact on the substrate surface, the MEMS hysteretic actuator may form a reliable electrical switch that is relatively simple to manufacture and operate.

14 Claims, 34 Drawing Sheets

Spring moves
17 um

Spring moves
back to final position

Latch moves
10 um

Latch moves
back

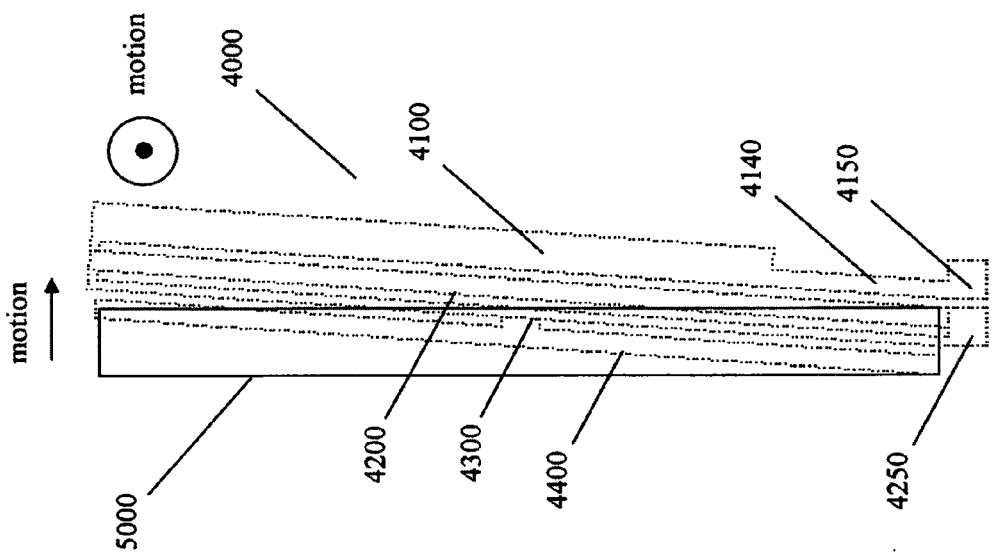
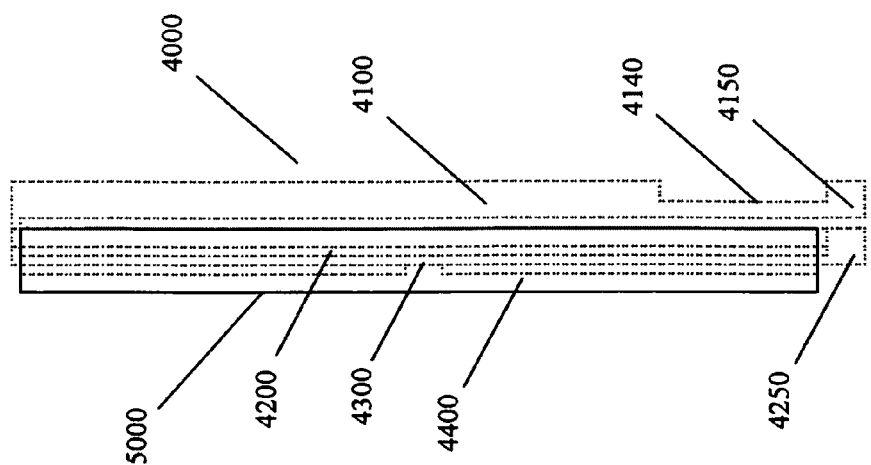

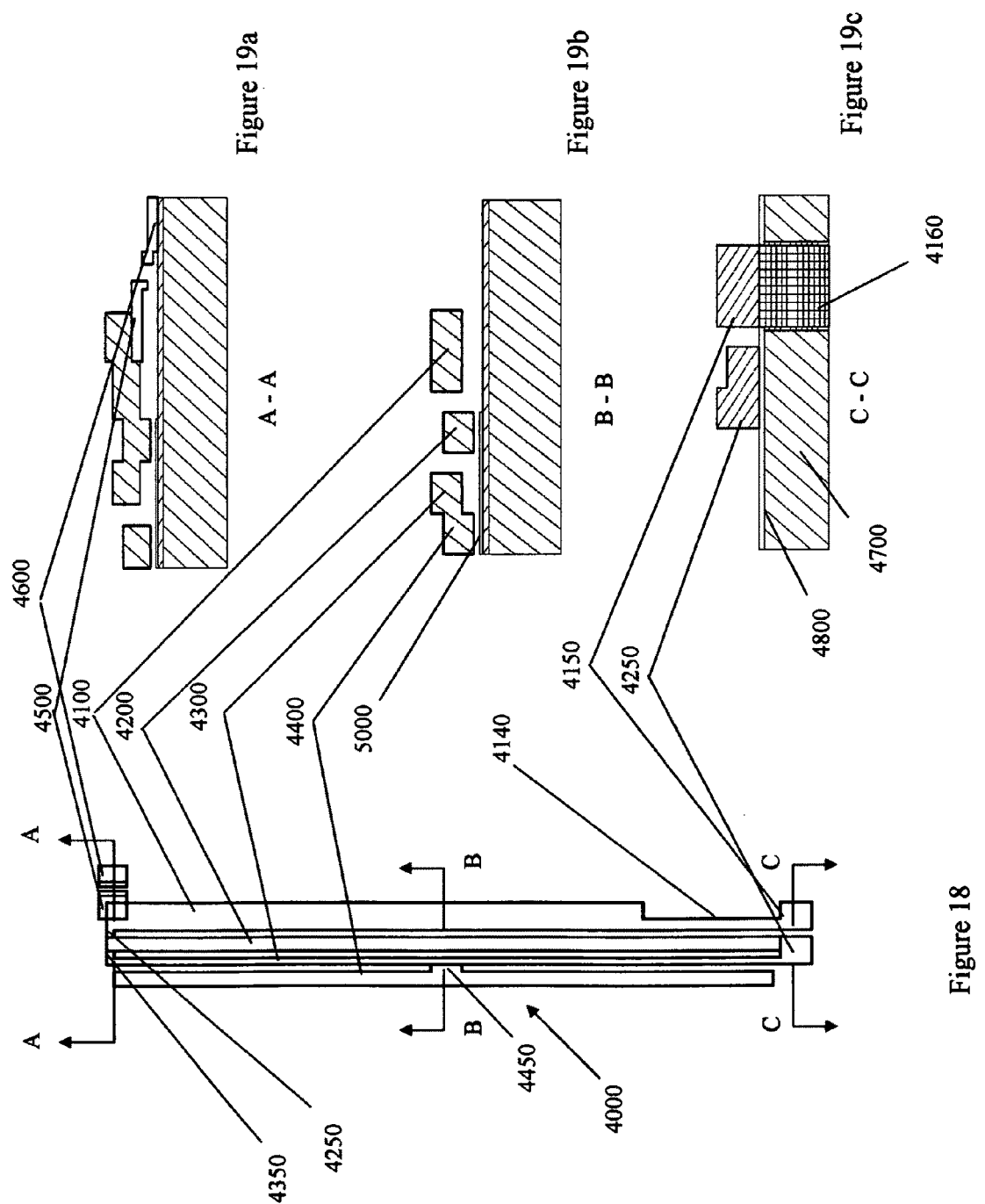

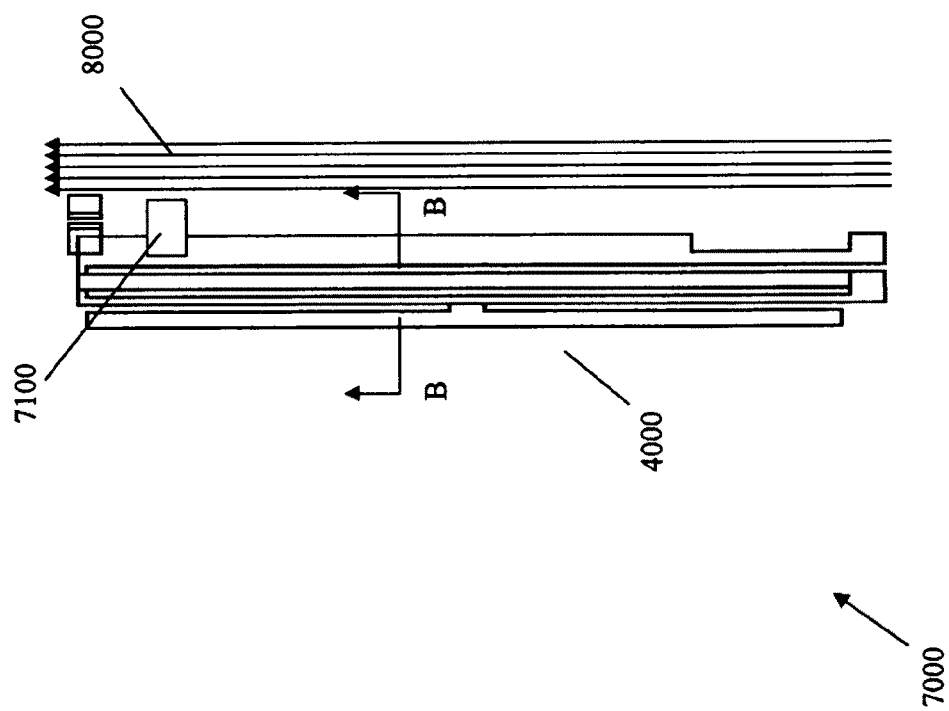

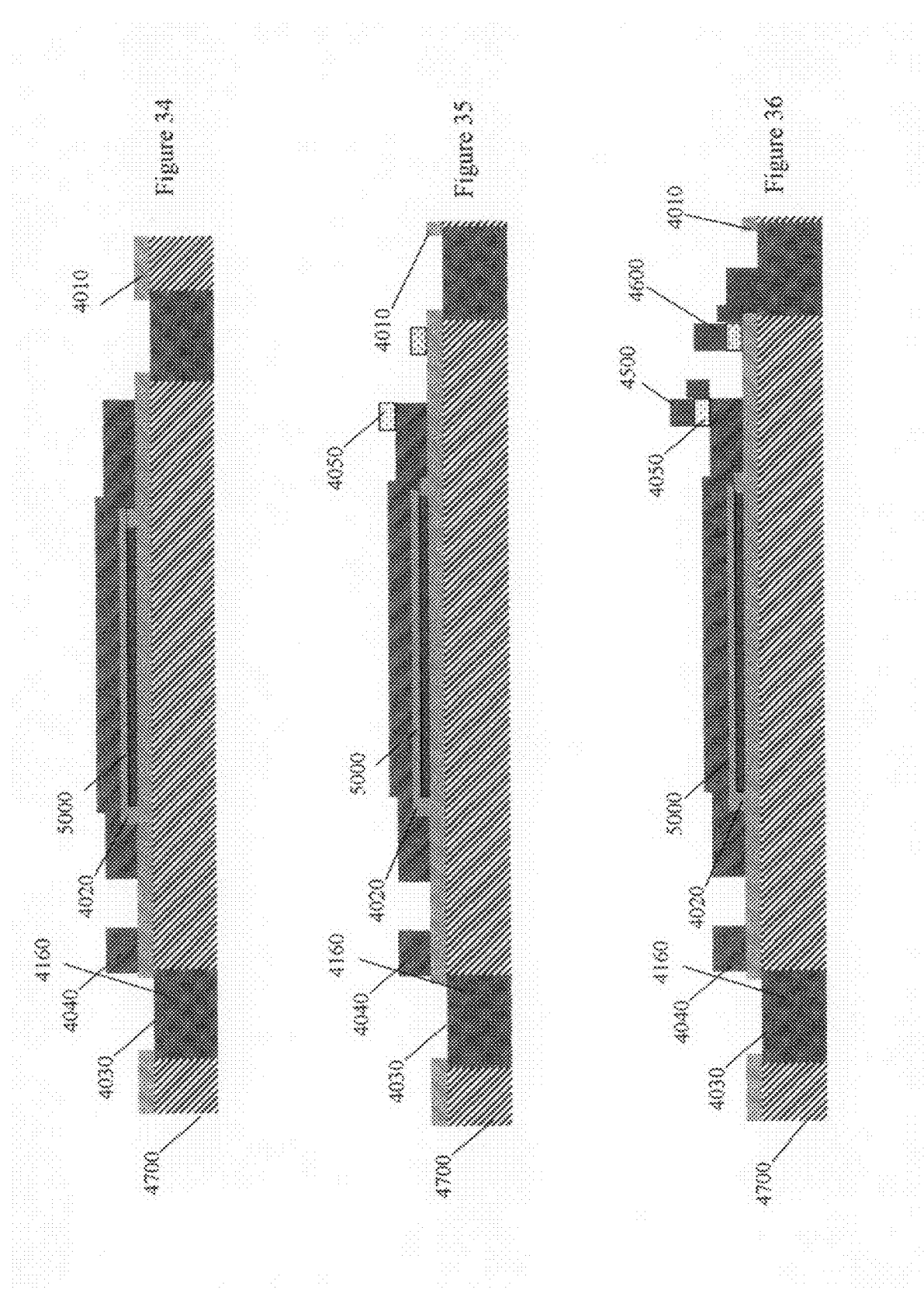

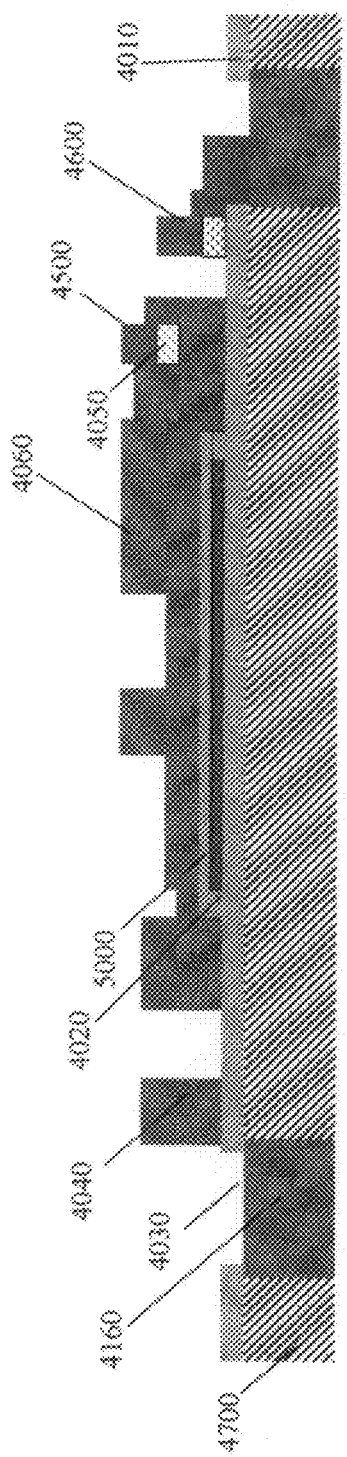
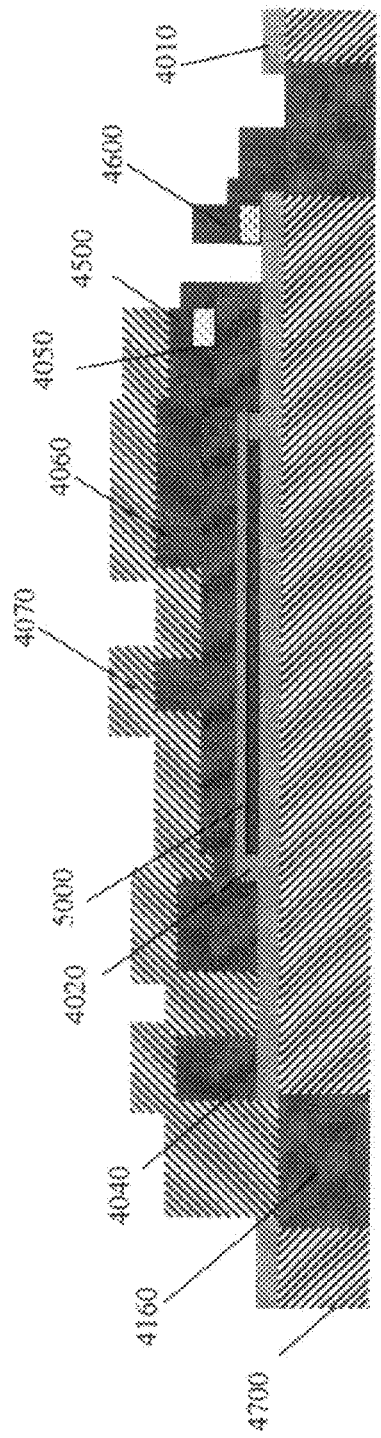

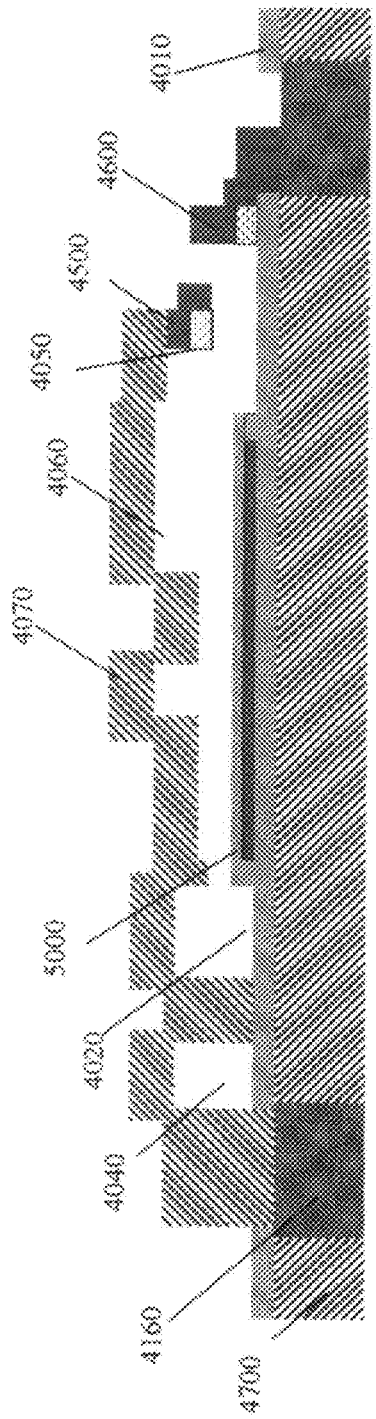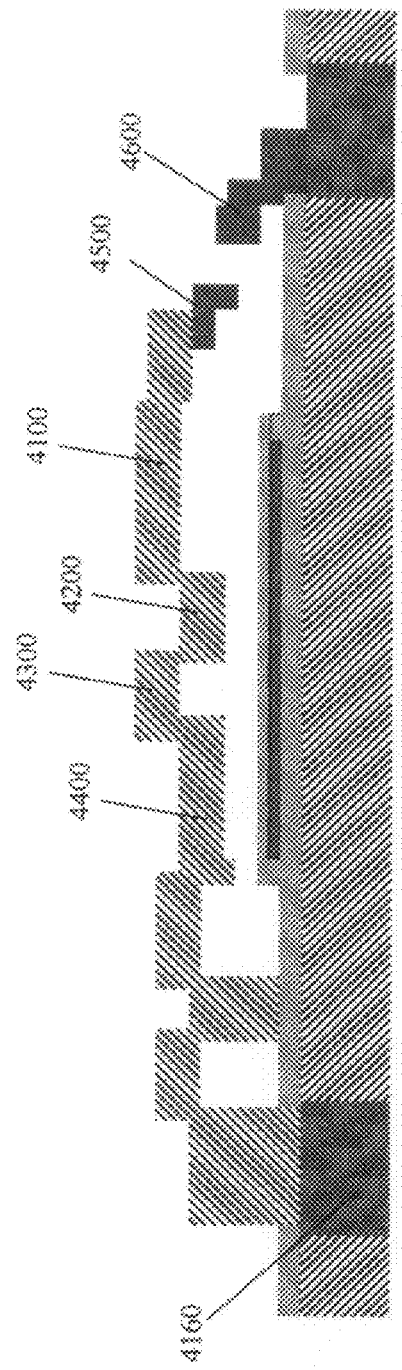

US 7,944,113 B2

HYSTERETIC MEMS THERMAL DEVICE AND METHOD OF MANUFACTURE

CROSS REFERENCE TO RELATED APPLICATIONS

This application is a continuation-in-part of U.S. patent application Ser. No. 11/705,738, filed Feb. 14, 2007, which is a continuation-in-part of U.S. patent application Ser. No. 11/334,438, filed Jan. 19, 2006, each of which is hereby incorporated by reference in their entireties.

STATEMENT REGARDING FEDERALLY SPONSORED RESEARCH

Not applicable.

STATEMENT REGARDING MICROFICHE APPENDIX

Not applicable.

BACKGROUND

1.) Field of the Invention

This invention relates to a microelectromechanical systems (MEMS) thermal device, and its method of manufacture. More particularly, this invention relates to a MEMS thermal actuator which is designed to move in a direction neither parallel to nor perpendicular to a surface of a substrate, and with motion hysteresis between the heating phase and the cooling phases of the actuator.

2) Description of Related Art

Microelectromechanical systems (MEMS) are very small moveable structures made on a substrate using lithographic processing techniques, such as those used to manufacture semiconductor devices. MEMS devices may be moveable actuators, valves, pistons, or switches, for example, with characteristic dimensions of a few microns to hundreds of microns. A moveable MEMS switch, for example, may be used to connect one or more input terminals to one or more output terminals, all microfabricated on a substrate. The actuation means for the moveable switch may be thermal, piezoelectric, electrostatic, or magnetic, for example.

FIG. 1 shows an example of a prior art thermal switch, such as that described in U.S. Patent Application Publication 2004/0211178 A1. The thermal switch 10 includes two cantilevers, 100 and 200. Each cantilever 100 and 200 contains a passive beam 110 and 210, respectively, which pivot about fixed anchor points 155 and 255, respectively. A conductive circuit 120 and 220, is coupled to each passive beam 110 and 210 by a plurality of dielectric tethers 150 and 250, respectively. When a voltage is applied between terminals 130 and 140, a current is driven through conductive circuit 120. The Joule heating generated by the current causes the circuit 120 to expand relative to the unheated passive beam 110. Since the circuit is coupled to the passive beam 110 by the dielectric tether 150, the expanding conductive circuit drives the passive beam in the upward direction 165.

Applying a voltage between terminals 230 and 240 causes heat to be generated in circuit 220, which drives passive beam 210 in the direction 265 shown in FIG. 1. Therefore, one beam 100 moves in direction 165 and the other beam 200 moves in direction 265. These movements may be used to open and close a set of contacts located on contact flanges 170 and 270, each in turn located on tip members 160 and 260, respectively. The sequence of movement of contact flanges 170 and 270 on tip members 160 and 260 of switch 10 is shown in FIGS. 2a-2d, to close and open the electrical switch 10.

To begin the closing sequence, in FIG. 2a, tip member 160 and contact flange 170 are moved about 10 µm in the direction 165 by the application of a voltage between terminals 130 and 140. In FIG. 2b, tip member 260 and contact flange 270 are moved about 17 µm in the direction 265 by application of a voltage between terminals 230 and 240. This distance is required to move twice the 5 µm width of the contacts, a 4 µm initial offset between the contact flanges 170 and 270, and additional margin for tolerances of 3 µm. In FIG. 2c, tip member 160 and contact flange 170 are brought back to their initial position by removing the voltage between terminals 130 and 140. This stops current from flowing and cools the cantilever 100 and it returns to its original position. In FIG. 2d, tip member 260 and contact flange 270 are brought back to nearly their original position by removing the voltage between terminals 230 and 240. However, in this position, tip member 160 and contact flange 170 prevent tip member 260 and contact flange 270 from moving completely back to their original positions, because of the mechanical interference between contact flanges 170 and 270. In this position, contact between the faces of contact flanges 170 and 270 provides an electrical connection between cantilevers 100 and 200, such that in FIG. 2d, the electrical switch is closed. Opening the electrical switch is accomplished by reversing the movements in the steps shown in FIGS. 2a-2d.

SUMMARY

The switch construction and method of manufacture may be simplified if a single MEMS actuator is capable of moving in two different directions, rather than having two MEMS actuators each moving in a single direction as shown. If a MEMS actuator is capable of moving in two different directions, then a MEMS device using a single fixed contact may be made using a single MEMS actuator. Furthermore, if the motion of the device is hysteretic, i.e. the motion is different upon heating than it is upon cooling, the actuator may be designed so as to latch in a détente position against the contact. If such an actuator can be designed, then the control of the switch may also be simplified, because only the single actuator may need to be controlled. Accordingly, it is desirable to design and fabricate a MEMS actuator which is capable of moving in two substantially different directions, and with motion which is hysteretic.

A MEMS device is described, which includes a cantilevered beam that bends about one or more points in at least two substantially different directions. The MEMS device also includes a driving means, wherein the driving means may include a drive beam tethered to the cantilever by at least one tether. Upon heating the drive beam, the drive beam expands to deform the cantilever. Upon cooling the drive beam, a heat sink located near the anchor point causes the drive beam to cool with a different temperature profile than it did upon heating, and therefore the cantilever deflects along a different trajectory upon cooling than it did upon heating.

Embodiments of the MEMS device are described, which include a MEMS segmented thermal actuator that may extend in two orthogonal directions by having at least two segments disposed orthogonally to each other. Each segment bends about a different point. Therefore, the MEMS hysteretic thermal actuator may have articulated motion, and be capable of moving in two substantially different directions.

Furthermore, the MEMS segmented thermal actuator may move along one trajectory while heating up, but may move in a second, substantially different trajectory while cooling down. In other words, the motion of the segmented thermal actuator may be hysteretic during the heating phase compared to the cooling phase. The segmented, hysteretic thermal actuator may therefore be used to close and latch an electrical switch, for example, as well as in any of a number of different applications, such as valves or pistons, which may require articulated, hysteretic motion.

Several embodiments of the MEMS hysteretic thermal actuator are disclosed. In a first embodiment, two substantially different directions of motion are achieved by including a substantially ninety-degree bend between two segments of a cool beam of the thermal actuator. A current-carrying element provides a hot driving beam, which expands relative to the cool beam. The current-carrying element is disposed adjacent to the two segments of the cool beam and heats up as current is driven through it. The current-carrying element expands upon heating, driving the first segment of the cool beam in one direction before the substantially ninety-degree bend, and driving the second segment of the cool beam in another direction after the substantially ninety-degree bend. Because the temperature profile of the beam depends on whether the beam is being heated or cooled, the beam moves differently upon heating than it does upon cooling, and therefore the motion is hysteretic.

In another exemplary embodiment, the MEMS segmented, hysteretic device consists of two segments and a rigid link joining the first segment to the second segment in an approximately rectilinear fashion. Upon heating an adjacent hot driving beam, the hot driving beam bends the first segment about its anchor point. Upon further heating, the hot driving beam bends the second segment about the rigid link. Upon cooling, the bending of the first segment about the anchor point relaxes before the second segment about the rigid link. Therefore, the motion of the MEMS segmented actuator is hysteretic, being different upon heating than upon cooling.

In yet another exemplary embodiment, a MEMS hysteretic thermal device includes a plurality of cantilevered beams whose neutral axes are disposed in different planes relative to the substrate surface. One of the beams is located in a plane beneath a passive beam, such that this beam drives the passive beam in a direction away from the substrate surface when heated. Another of the beams is formed in the same plane as the passive beam, such that it drives the passive beam laterally in a plane parallel to the substrate surface when heated. Heat is supplied to the beams by a heating element formed on the substrate surface, adjacent to the plurality of beams. The driving beams drive the passive beams at an angle of about 45 degrees with respect to the substrate surface upon being heated by the heating element. Upon cooling, the tip of the beam descends quickly toward the substrate surface before being pulled laterally back across the surface towards its starting point.

Accordingly, this embodiment may include a heating element disposed on the surface of the substrate, and a plurality of beams with their neutral axes formed in a plurality of planes parallel to the surface of the substrate and anchored at their proximal ends to the substrate by at least one anchor point, wherein the plurality of beams is coupled one to another at or near their distal ends, and wherein the plurality of beams is configured to move in a trajectory that is neither parallel to nor perpendicular to the surface of the substrate, when heated by the heating element.

These and other features and advantages are described in, or are apparent from, the following detailed description.

BRIEF DESCRIPTION OF THE DRAWINGS

Various exemplary details are described with reference to the accompanying drawings, which however, should not be taken to limit the invention to the specific embodiments shown but are for explanation and understanding only.

FIG. 16a is a plan view of a tenth exemplary embodiment of a MEMS hysteretic thermal actuator with a heating element disposed adjacent to the actuator. FIG. 16b is a plane view of the MEMS thermal actuator of FIG. 16a upon heating and deflection of the actuator by the adjacent heating element;

FIG. 18 is a schematic view of a the MEMS hysteretic thermal actuator of FIG. 16;

FIG. 19a-19c are three cross sectional views of the MEMS hysteretic thermal actuator of FIG. 16;

FIG. 28 illustrates an embodiment of a variable optical attenuator using a MEMS hysteretic thermal actuator;

FIGS. 31-40 are simplified schematic cross sectional views of the MEMS hysteretic thermal actuator during various steps of its fabrication.

DETAILED DESCRIPTION

Although the systems and methods described herein are applied to an electrical switch, it should be understood that this is only one embodiment, and that the systems and methods may be appropriate for any number of devices, such as valves, pistons, variable optical attenuators and other devices using movable actuators.

A MEMS hysteretic device is described, which includes a plurality of cantilevered beams that extend from at least one anchor point attached to the surface of a substrate. The MEMS hysteretic device may also include a driving means, which drives a motion of a passive component, which may be one of the plurality of cantilevered beams. In some embodiments, the driving means may include a drive beam coupled to a cantilevered beam by at least one tether. Upon heating the drive beam, the drive beam expands to deform the cantilever. Upon cooling the drive beam, a heat sink located near the anchor point causes the drive beam to cool with a different temperature profile than it did upon heating, and therefore the cantilever deflects along a different trajectory upon cooling than it did upon heating.

In some embodiments, the drive means may be beams which are coupled to the passive component at proximal and distal ends, wherein the beams may be heated by current which travels through the drive beams, heating the beams by Joule heating. The heat then exits through an anchor points of the beams.

In other embodiments, the drive means may be beams which are coupled to the passive component at proximal and distal ends, which are heated by an adjacent heating element, which may be separate and apart from the MEMS hysteretic device.

Figure 3:
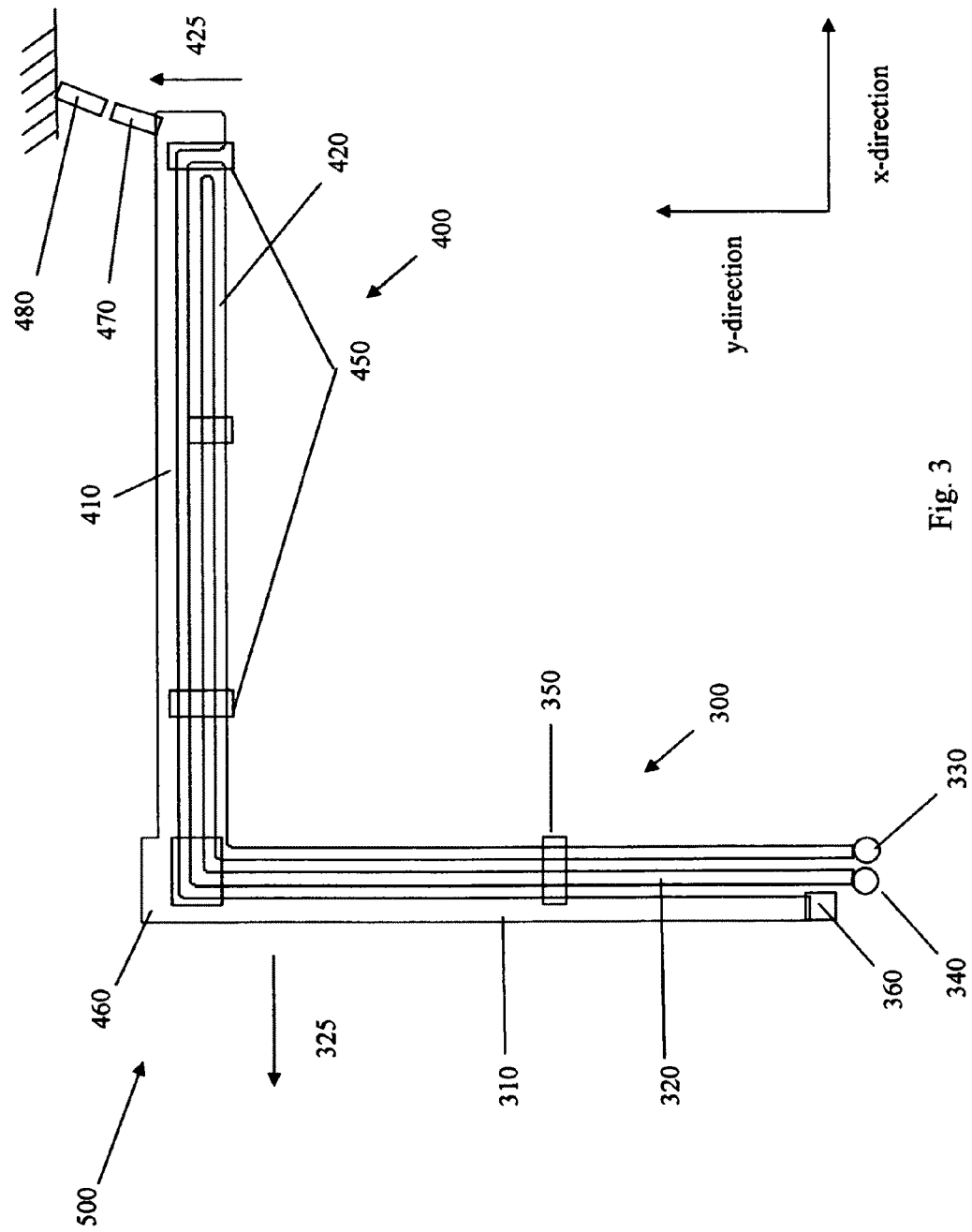
FIG. 3 is a diagram illustrating a first exemplary embodiment of a MEMS segmented thermal actuator.

FIG. 3 is a diagram illustrating a first exemplary embodiment of a MEMS hysteretic thermal actuator 500. MEMS hysteretic thermal actuator 500 includes two beam segments 300 and 400, which are joined at a substantially ninety-degree joint 460. The first segment 300 includes a first drive beam portion 320 disposed adjacent, and coupled to a first cool, passive beam portion 310. Similarly, the second segment 400 includes a second drive beam portion 420 disposed adjacent, and coupled to a second cool, passive beam portion 410. Current is input to the drive beam portions 320 and 420 at contacts 330 and 340, and the current circulating in the drive beam circuit heats portions 320 and 420 by joule heating. The drive beams 320 and 420 are mechanically coupled to the passive beam portions 310 and 410 by dielectric tethers 350 and 450, respectively. The dielectric tethers 350 and 450 may be made of any convenient, non-conducting material which couples the drive beam portions 320 and 420 to segmented passive beam portions 310 and 410 mechanically, but not electrically. In one embodiment, dielectric tethers 350 and 450 may be made from an epoxy-based photoresist such as SU-8, a negative photoresist developed by IBM of Armonk, N.Y.

The heat generated in the drive beam circuit flows out predominantly through the contacts 330 and 340, and to a lesser extent by radiation and convection to the closely spaced substrate, about 4 um from the drive beam circuit. Because heat is generated all along the drive beams 320 and 420, and flows out predominantly through the contacts 330 and 340 which act as heat sinks, the point in the drive beam circuit which is at the maximum temperature starts out being located adjacent to the ninety degree joint 460 or at a location approximately midway to the distal end of the drive beam 420. As the temperature continues to rise, however, the location of maximum temperature begins to move out along the drive beam circuit, away from contacts 330 and 340. If the duration of the current pulse is long enough, the point of maximum temperature will occur near the distal end of the drive circuit. The heat generated causes the first drive beam portion 320 and the second drive beam portion 420 to expand, which bends the first segment 300 in the negative x-direction 325 about the anchor point 360, and bends the second segment 400 in the positive y-direction 425 about the substantially ninety-degree joint 460.

When the current pulse ceases, the drive beam begins to cool. Since the dominant heat sink is located at the contacts 330 and 340, the first drive beam portion 320, located closer to the heat sink 330 and 340, cools faster than the second drive beam portion 420, which is located further from heat sinks 330 and 340. As a result, the first segment 300 of the MEMS hysteretic thermal actuator 500 relaxes before the second segment 400. Therefore, when the MEMS hysteretic thermal actuator 500 is heating, it bends in a trajectory that is different from the trajectory upon cooling, resulting in hysteretic behavior when the trajectory is plotted on a graph, as described below.

Figure 4:
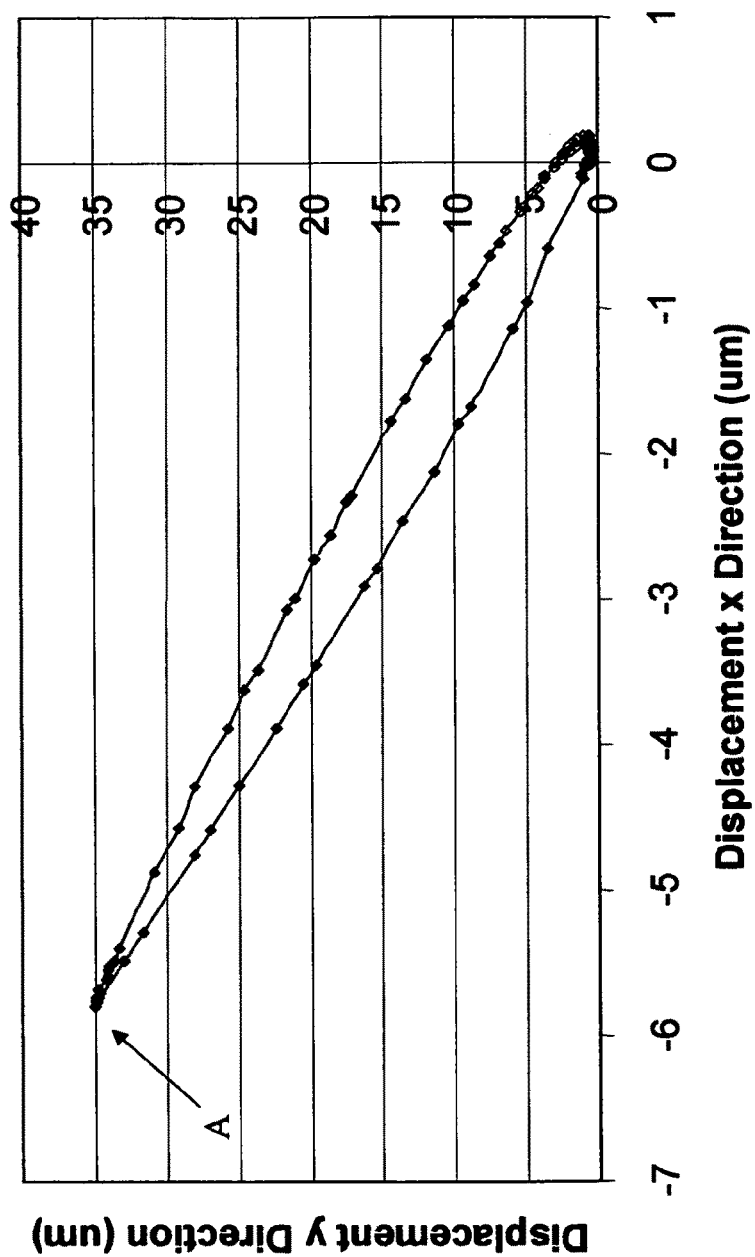
FIG. 4 is a plot of the results of a simulation predicting the behavior of the MEMS hysteretic thermal actuator of FIG. 3 in response to the application of a square wave current pulse.

FIG. 4 is a plot showing the results of a mathematical simulation using an ANSYS multi-physics finite element model, which simulates the deflection of the tip of the passive beam that results from the heating of the drive beam with a square wave current pulse. The current pulse used for FIG. 4 is 190 mA amplitude and 3 μsec duration. Each point in the plot corresponds to an equal increment of time. As shown in FIG. 4, the tip of the MEMS hysteretic thermal actuator 500 moves in the positive y-direction and the negative x-direction (the x- and y-axes are indicated in FIG. 3). The movement in the positive y-direction is accomplished largely by beam portion 400, and movement in the negative x-direction is accomplished largely by beam portion 300. The slope of the trajectory of the tip end is approximately −6, such that for every displacement of −1 μm in the negative x-direction, the y-displacement increases by about 6 µm. At the upper left of the displacement trajectory, at the point labeled A, the current pulse ceases, and the drive beam begins to cool. The cooling, as described above, relaxes the beam portion 300 first in the x-direction, followed by the beam portion 400 in the y-direction, so that the trajectory of the beams upon cooling is different than the trajectory of the beams upon heating. This is illustrated by the hysteresis seen in the curves shown in FIG. 4. The hysteresis is evident in the different slope of the upper trajectory compared to the lower trajectory. The slope of the upper trajectory is about 5.6 compared to the slope of about 6 for the lower trajectory. The nominal difference in the location of the tip end on the upper trajectory compared to the lower trajectory is on the order of about 5 µm for this current waveform. This hysteresis may be used to latch and unlatch the MEMS hysteretic actuator, when the actuator is used in a switch for example, as described further below.

Returning to FIG. 3, MEMS hysteretic thermal actuator 500 may be used to open and close an electrical switch. To implement this switch, MEMS hysteretic thermal actuator 500 is formed with a contact 470, which is adjacent to another contact 480 which is rigidly affixed to the substrate. The two contacts 470 and 480 may be made of different material than segmented beams 310, 320, 410 and 420. The contacts 470 and 480 may be made of a material which has a low contact resistance relative to the material of segmented beams 310, 320, 410 and 420. In one embodiment, the contacts 470 and 480 are gold, however, other materials such as gold-cobalt alloy, a gold-palladium alloy, etc., may be used as well. In this embodiment, an electrical signal may flow from segmented beams 310 and 410 to contact 470 and then to contact 480 when the switch is closed. However, in another alternative embodiment described below with respect to FIGS. 19, 20a and 20b, the electrical signal may flow between two contacts located beyond the tip of segmented beam 410, rather than through segmented beam 410 to the contact.

Figure 1:
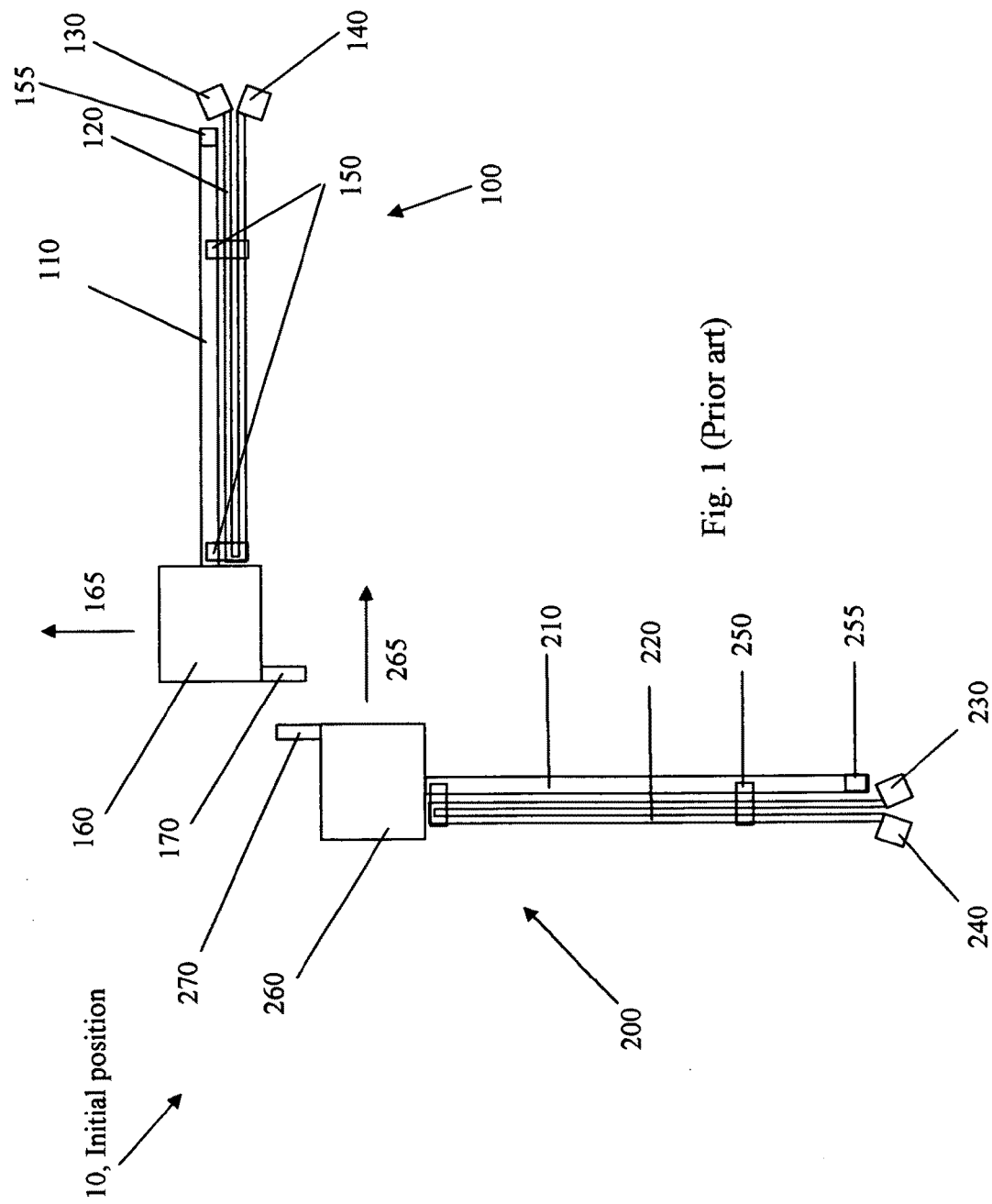
FIG. 1 is a schematic view of a prior art MEMS thermal switch.

In the quiescent state, the two contacts 470 and 480 of MEMS hysteretic thermal switch 500 may be located adjacent to each other, rather than one in front of the other as is the case with contact flanges 170 and 270 shown in FIG. 1.

Figure 2B:
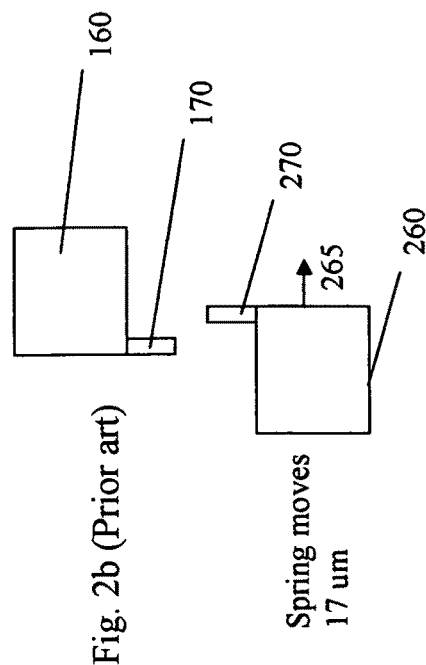
FIGS. 2a-2d are diagrams illustrating the sequence of movements required to close the switch illustrated in FIG. 1.
Figure 2D:
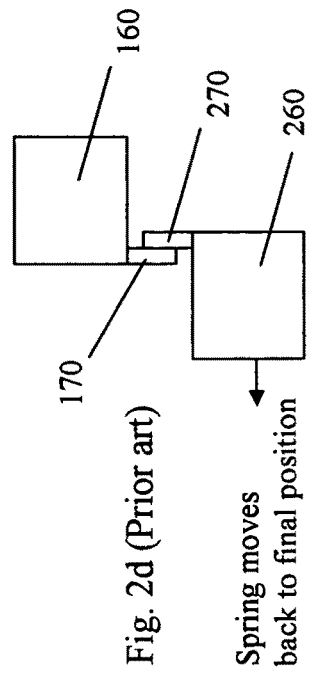
Figure 2A:
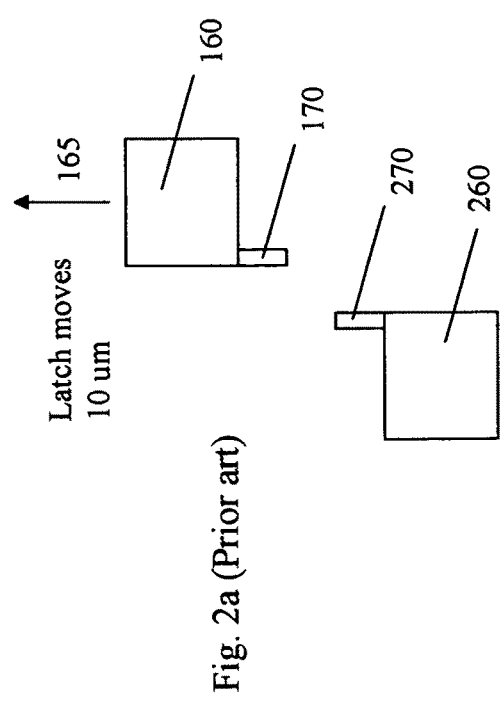
Figure 2C:
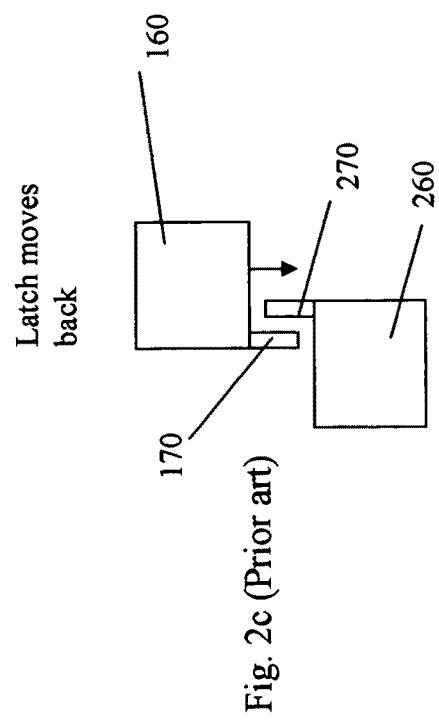

Because of the location of contacts 470 and 480 may be adjacent to one another, contact 470 does not need to be retracted as was shown in FIG. 2a. Instead, the sequence of motion for the MEMS hysteretic thermal actuator 500 is shown as shown in FIG. 4, wherein upon energizing the drive beam, the tip of the cool beam moves up and to the left. Upon cessation of the drive current pulse, the cool beam relaxes on the upper trajectory shown in FIG. 4, whereupon it becomes engaged on contact 480, because it relaxes more quickly in the x-direction than the y-direction. The spring constant of the MEMS hysteretic thermal actuator 500 causes the switch to remain latched, because it exerts a normal force on the contact surfaces 470 and 480. The contact surfaces 470 and 480 remain engaged because of friction between the contact surfaces 470 and 480. Alternatively, the contact surfaces 470 and 480 may be shaped so that they remain engaged even without friction. Techniques and design considerations for such a switch are described in U.S. patent application Ser. No. 11/263,912 (herein the '912 application), which is incorporated by reference in its entirety for all purposes.

To unlatch the MEMS hysteretic actuator 500, a square wave current pulse may again be applied to the drive beams 320 and 420. The unlatching current pulse may be of a lower amplitude and/or shorter duration than the latching current pulse. The resulting movement of the MEMS hysteretic thermal actuator releases the MEMS hysteretic thermal actuator from its engagement with contact 480. The restoring force of beam portion 400 may be designed to provide sufficient retraction of beam portion 400 to clear the engaging contact 480. The unlatch pulse may also be tailored in pulse shape, magnitude and duration to assure that MEMS hysteretic actuator 500 is released from the latched position.

Figure 5:
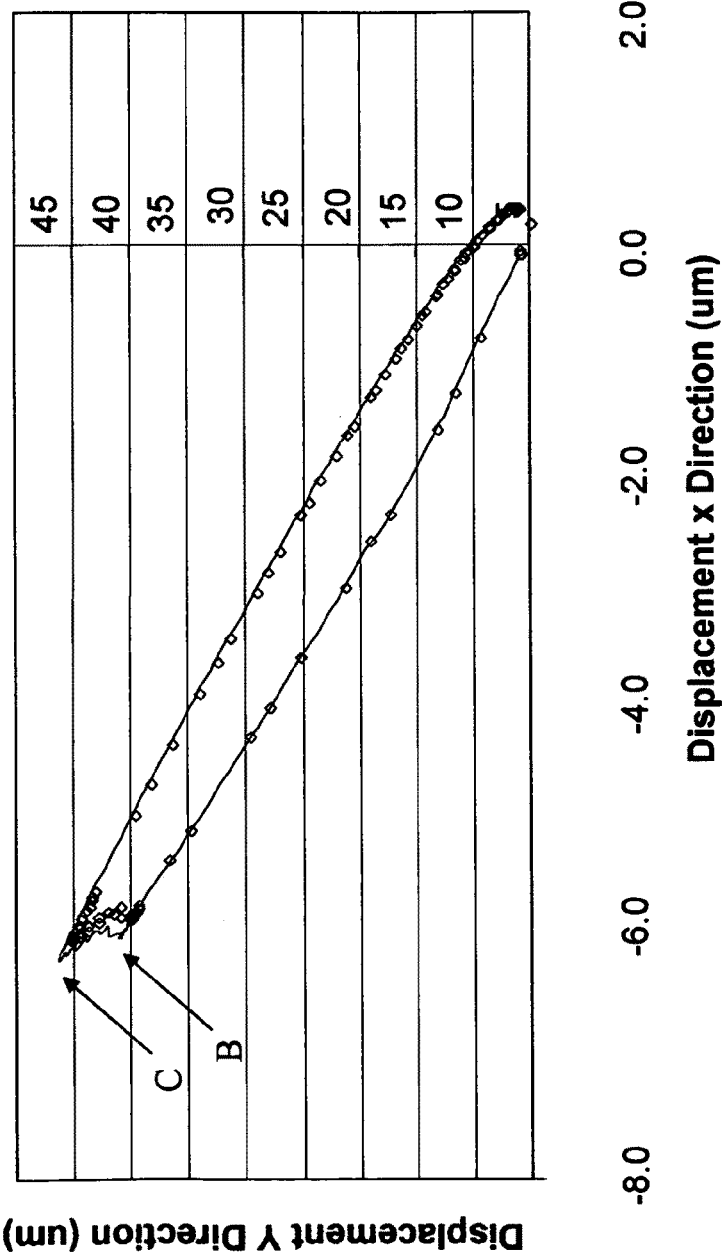
FIG. 5 is a plot of the results of a simulation predicting the behavior of the MEMS hysteretic thermal actuator of FIG. 3 in response to the application of a first square wave current pulse followed by another short current pulse.

The hysteresis shown in FIG. 4 may also be enhanced, if needed, by tailoring the shape of the current pulse applied to drive beams 320 and 420. For example, if the first 3 µsec, 190 mA current pulse is followed immediately by a second, lower current pulse of 160 mA for another 3 µsec, the trajectory of the tip of the MEMS hysteretic actuator 500 is as shown in FIG. 5. In FIG. 5, the second current pulse is applied at the point labeled B in the graph. The current ceases at the point labeled C in the graph, and the upper trajectory describes the relaxation of the MEMS hysteretic actuator 500. The result of the second current pulse is to hold the MEMS hysteretic thermal actuator 500 in approximately its deformed shape, while the additional heat provided by the additional current moves the point of maximum temperature from a location about ⅔ down the length of the MEMS hysteretic thermal actuator 500 to the tip end of the MEMS hysteretic thermal actuator 500. As a result, the hysteresis experienced by the cooling MEMS hysteretic thermal actuator 500 may be exaggerated, because the heat built up in the tip end of the MEMS hysteretic thermal actuator 500 takes longer to dissipate through the far-removed contacts 330 and 340.

Although FIG. 5 shows results for one particular example of a tailored pulse shape, it should be clear that a large number of alternative pulse shapes or pulse trains can be envisioned, such as a triangular, ramped or saw-toothed pulse shape, to accomplish other objectives with the MEMS hysteretic actuator 500, or enhance its performance in other ways.

Additional features of the MEMS hysteretic actuator 500 may be used to adjust the deflection of the MEMS hysteretic actuator 500. For example, areas in the passive beams 310 and 410 may be removed to form a flexible hinge, to enhance the deflection of the passive beams 310 and 410 about their respective anchor points. Design considerations and implementation of such features are described further in the incorporated '912 application.

Figure 6:
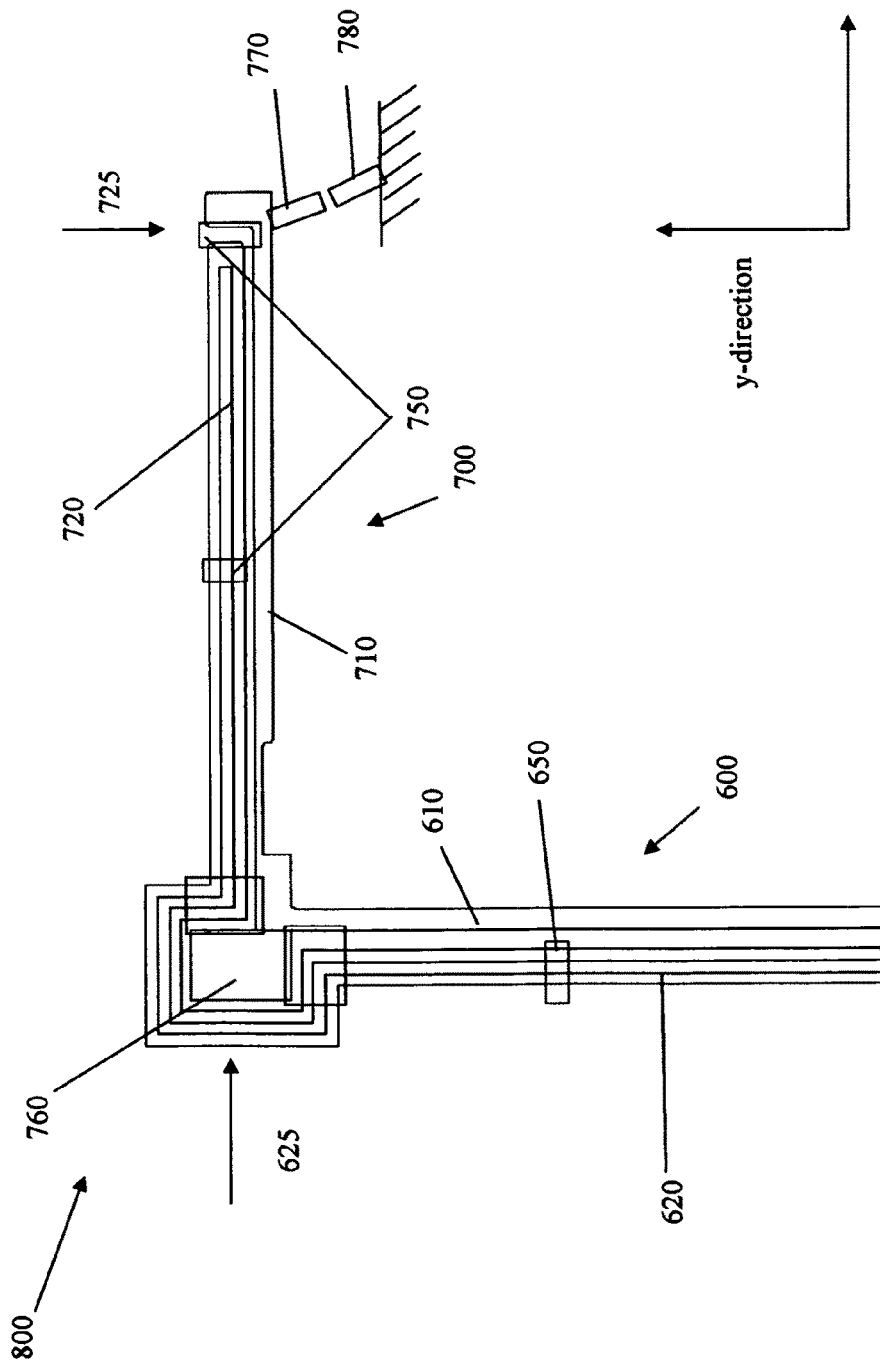
FIG. 6 is a diagram illustrating a second exemplary embodiment of a MEMS hysteretic thermal actuator.

FIG. 6 is a diagram illustrating a second exemplary embodiment of the MEMS hysteretic thermal actuator 800. In the second exemplary embodiment, as in the first exemplary embodiment, the MEMS hysteretic thermal actuator 800 includes two beam portions 600 and 700 coupled by a substantially ninety-degree joint 760. Beam portions 600 and 700 are coupled to pivot anchor 660 and joint 760, respectively. Each beam portion 600 and 700 includes a drive beam portion 620 and 720 and a cool beam portion 610 and 710. However, in the second exemplary embodiment, the drive beam portions 620 and 720 are disposed on the opposite side of passive beam portions 610 and 710, compared to the first exemplary embodiment. For this reason, MEMS hysteretic thermal actuator 800 bends in an opposite sense to MEMS hysteretic thermal actuator 500, as drive beam portion 620 tends to bend passive beam portion 610 in the positive x-direction 625 rather than the negative x-direction. Similarly, drive beam portion 720 tends to bend passive beam portion 710 in the negative y-direction 725 rather than the positive y-direction. Upon cooling, because of its proximity to the heat sink of contacts 630 and 640, the drive beam 620 cools more rapidly than drive beam 720, resulting in hysteretic behavior of the MEMS hysteretic actuator 800. Therefore, the behavior of this MEMS hysteretic actuator 800, if plotted on a graph similar to FIGS. 4 and 5, would show the inverse behavior. The tip end of the MEMS hysteretic thermal actuator would therefore be driven to the lower right of FIG. 6. Accordingly, to make an electrical switch using MEMS hysteretic thermal actuator 800, the contacts 770 and 780 would be placed as shown in FIG. 6.

Figure 7:
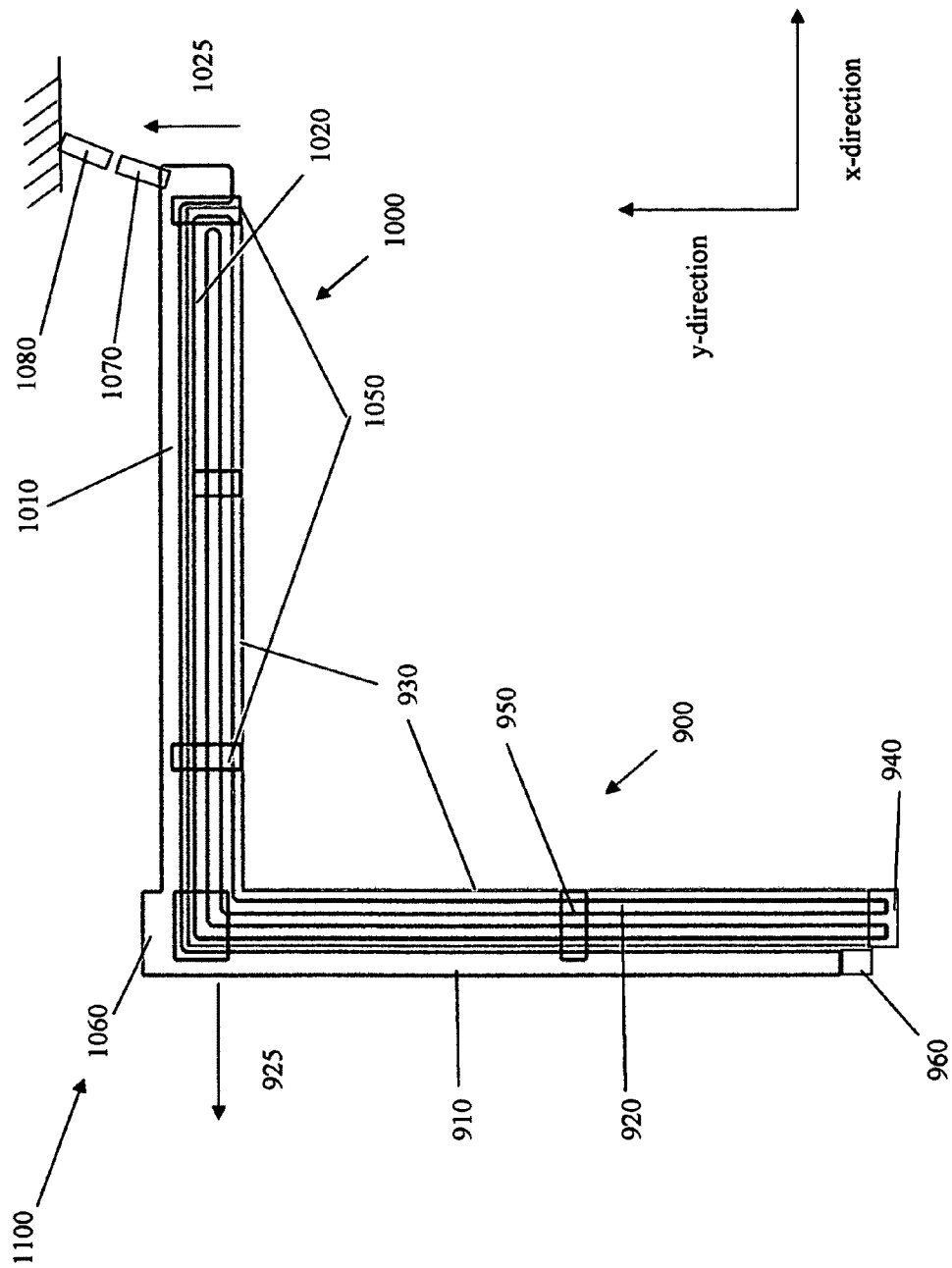
FIG. 7 is a diagram illustrating a third exemplary embodiment of a MEMS hysteretic thermal actuator, in which a heater element is disposed adjacent to the drive beams.

FIG. 7 is a diagram illustrating a third exemplary embodiment of the MEMS hysteretic actuator 1100. As with the previous embodiments, the MEMS hysteretic thermal actuator 1100 includes two beam portions 900 and 1000 coupled by a substantially ninety-degree joint 1060. Each beam portion 900 and 1000 includes a drive beam portion 920 and 1020 and a passive beam portion 910 and 1010. Drive beam portions 920 and 1020 may be coupled to passive beam portions 910 and 1010 by tethers 950 and 1050, respectively. Tethers 950 and 1050 may be thermally insulating, though not necessarily electrically insulating.

In the second exemplary embodiment, the drive beam portions 920 and 1020 are disposed adjacent to a heater element 930, which supplies heat to the drive beam portions 920 and 1020. The heater element also has a heat sink 940 disposed at its base, which dissipates heat when the heater element 930 is disabled. The heater element 930 may include, for example, an electrical circuit arranged in a serpentine pattern within heater element 930. For simplicity of depiction, however, the electrical circuit is not shown in FIG. 7, and the heater element 930 is shown as a simple outline overlaying drive beam portions 920 and 1020. It should be understood, however, that the heater element 930 may generate heat in any of a number of other ways, for example, it may be an optically opaque element which absorbs incident light.

Upon becoming heated by the heater element 930, drive beam portions 920 and 1020 expand, driving passive beam portions 910 and 1010 in directions 925 and 1025, respectively. Upon cooling, because of its proximity to the heat sink 940 of heater element 930, the drive beam 920 cools more rapidly than drive beam 1020, resulting in hysteretic behavior of the MEMS hysteretic actuator 1100. Accordingly, the behavior of MEMS hysteretic thermal actuator 1100 is similar to that of MEMS hysteretic thermal actuator 500, and can be described qualitatively by the plots shown in FIGS. 4 and 5. A latching electrical switch may be made using MEMS hysteretic actuator 1100, by disposing contacts 1070 and 1080 as shown in FIG. 7.

Figure 8:
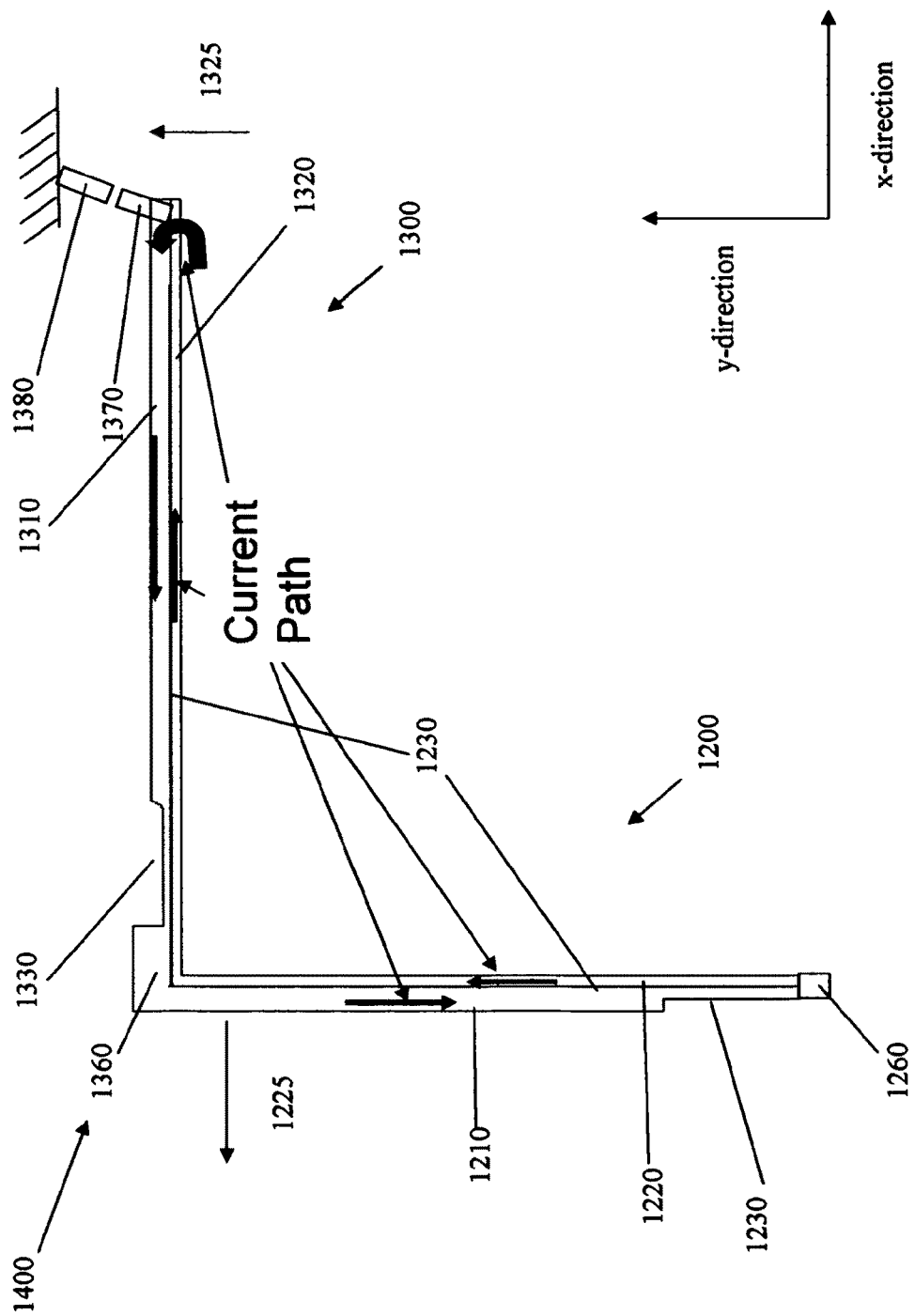
FIG. 8 is a diagram illustrating a fourth exemplary embodiment of a MEMS hysteretic thermal actuator, in which current flows through and heats a high coefficient of thermal expansion material along with a low coefficient of thermal expansion material.

FIG. 8 is a diagram illustrating a fourth exemplary embodiment of MEMS hysteretic actuator 1400. As with the previous embodiments, the MEMS hysteretic thermal actuator 1400 includes two beam portions 1200 and 1300 coupled by a substantially ninety-degree joint 1360. Each beam portion 1200 and 1300 includes a drive beam portion 1220 and 1320 and a passive beam portion 1210 and 1310. The drive beam portions 1220 and 1320 are separated from the passive beam portions 1210 and 1310 by a dielectric barrier 1230 which extends out toward the end region of the second beam portion 1300, but ends before the edge of second beam portion 1300. The flexibility of the two segments 1200 and 1300 to bending about the anchor point 1260 and rigid link 1360, respectively, may be adjusted by removing an area of material 1230 and 1330, near their pivot points, which causes segments 1200 and 1300 to pivot more easily about these points.

The drive beam portions 1220 and 1320 may be formed of a material having a higher coefficient of thermal expansion (CTE), relative to passive beam portions 1210 and 1310, which are formed of a material having a lower coefficient of thermal expansion. However, all of beam portions 1220, 1320, 1210 and 1310 are electrically conductive. A current is driven through drive beam portions 1220 and 1320 to the end of the second beam portion 1300, whereupon the current reverses direction and flows out through passive beam portion 1310 and 1210. The current causes joule heating in both beam portions 1200 and 1300. However, because drive beam portions 1220 and 1320 are formed from a material having a higher coefficient of thermal expansion relative to passive beam portions 1210 and 1310, drive beam portions expand relative to passive beam portions 1210 and 1310. Accordingly, drive beam portions 1220 and 1320 bend the passive beam portions 1210 and 1310 about anchor point 1260 and substantially ninety-degree joint 1360, respectively. Upon cooling, because of its proximity to the heat sink of anchor point 1260, the drive beam 1220 cools more rapidly than drive beam 1320, resulting in hysteretic behavior of the MEMS hysteretic actuator 1400. Accordingly, the behavior of MEMS hysteretic thermal actuator 1400 is similar to that of MEMS hysteretic thermal actuator 500, and can be described by plots similar to those shown in FIGS. 4 and 5. A latching electrical switch may be made using MEMS hysteretic actuator 1400, by disposing contacts 1370 and 1380 as shown in FIG. 8.

Figure 9:
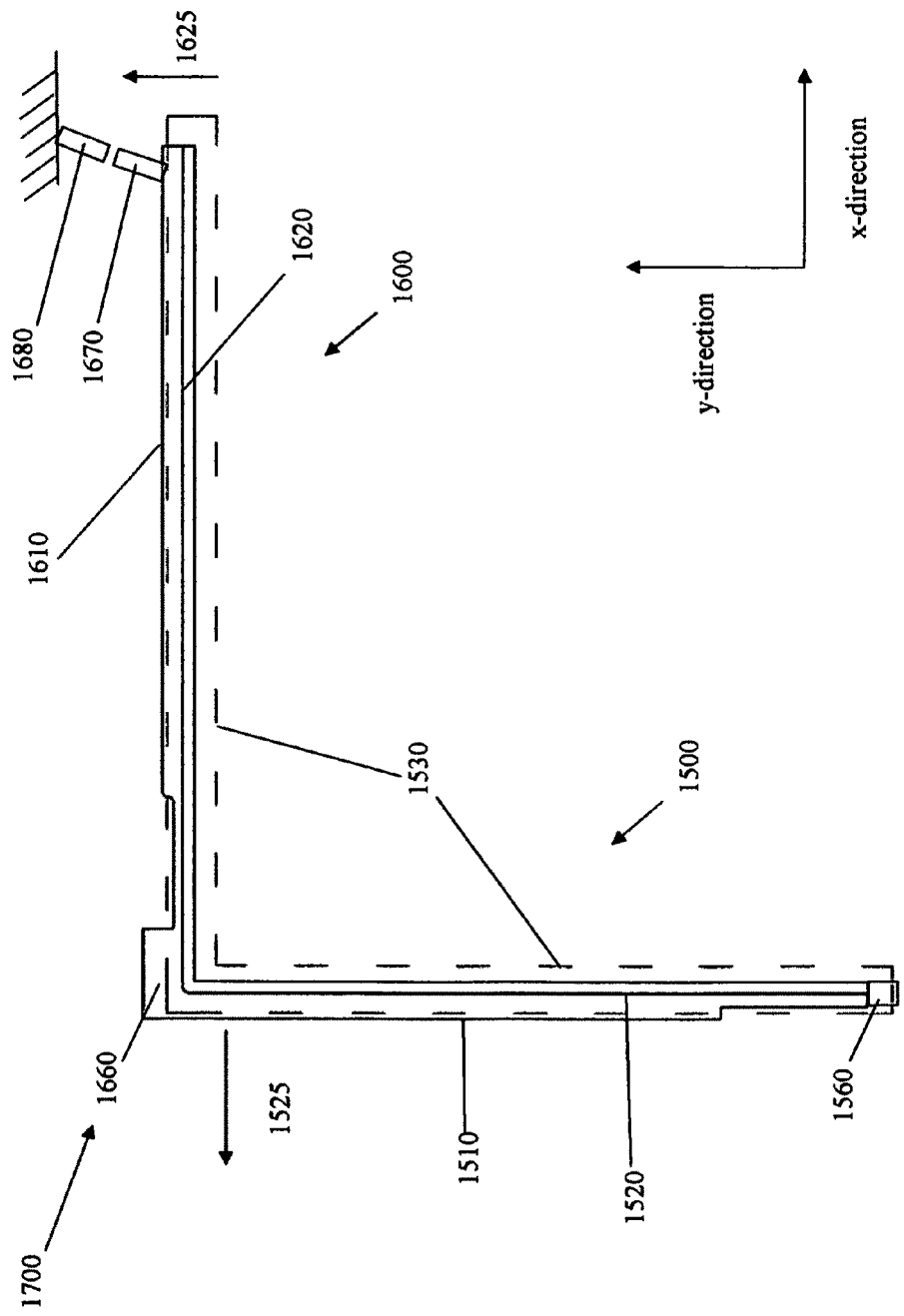
FIG. 9 is a diagram illustrating a fifth exemplary embodiment of a MEMS hysteretic thermal actuator, in which a heater is disposed adjacent to a low coefficient of thermal expansion member and a high coefficient of thermal expansion member.

FIG. 9 is a diagram illustrating a fifth exemplary embodiment of MEMS hysteretic thermal actuator 1700. As with the previous embodiments, the MEMS hysteretic thermal actuator 1700 includes two beam portions 1500 and 1600 coupled by a substantially ninety-degree joint 1660. Each beam portion 1500 and 1600 includes a drive beam portion 1520 and 1620 and a passive beam portion 1510 and 1610. The fifth exemplary embodiment is also similar to the fourth exemplary embodiment, in that the drive beam portions 1520 and 1620 are formed from a material having a higher coefficient of thermal expansion, and the passive beam portions 1510 and 1610 are formed from a material having a lower coefficient of thermal expansion. However, in the fifth exemplary embodiment, beam portions 1510, 1520, 1610 and 1620 need not be electrically conductive, because heat is supplied by a heater element 1530. Heater element 1530 may be a conductive circuit with wires formed in a serpentine pattern, or may be any other device capable of generating heat. The heat generated by heater element 1530 is absorbed by drive beam portions 1520 and 1620, as well as passive beam portions 1520 and 1610. However, because drive beam portions 1520 and 1620 are formed from a material having a higher coefficient of thermal expansion relative to passive beam portions 1510 and 1610, drive beam portions expand relative to passive beam portions 1510 and 1610. Accordingly, drive beam portions 1520 and 1620 bend the passive beam portions 1510 and 1610 about anchor point 1560 and substantially ninety-degree joint 1660, respectively. Upon cooling, because of its proximity to the heat sink of the anchor point 1560, the drive beam 1520 cools more rapidly than drive beam 1620, resulting in hysteretic behavior of the MEMS hysteretic actuator 1700. Accordingly, the behavior of MEMS hysteretic thermal actuator 1700 is similar to that of MEMS hysteretic thermal actuator 500, and can be described by plots similar to those shown in FIGS. 4 and 5. A latching electrical switch may be made using MEMS hysteretic actuator 1700, by disposing contacts 1670 and 1680 as shown in FIG. 9.

Figure 10:
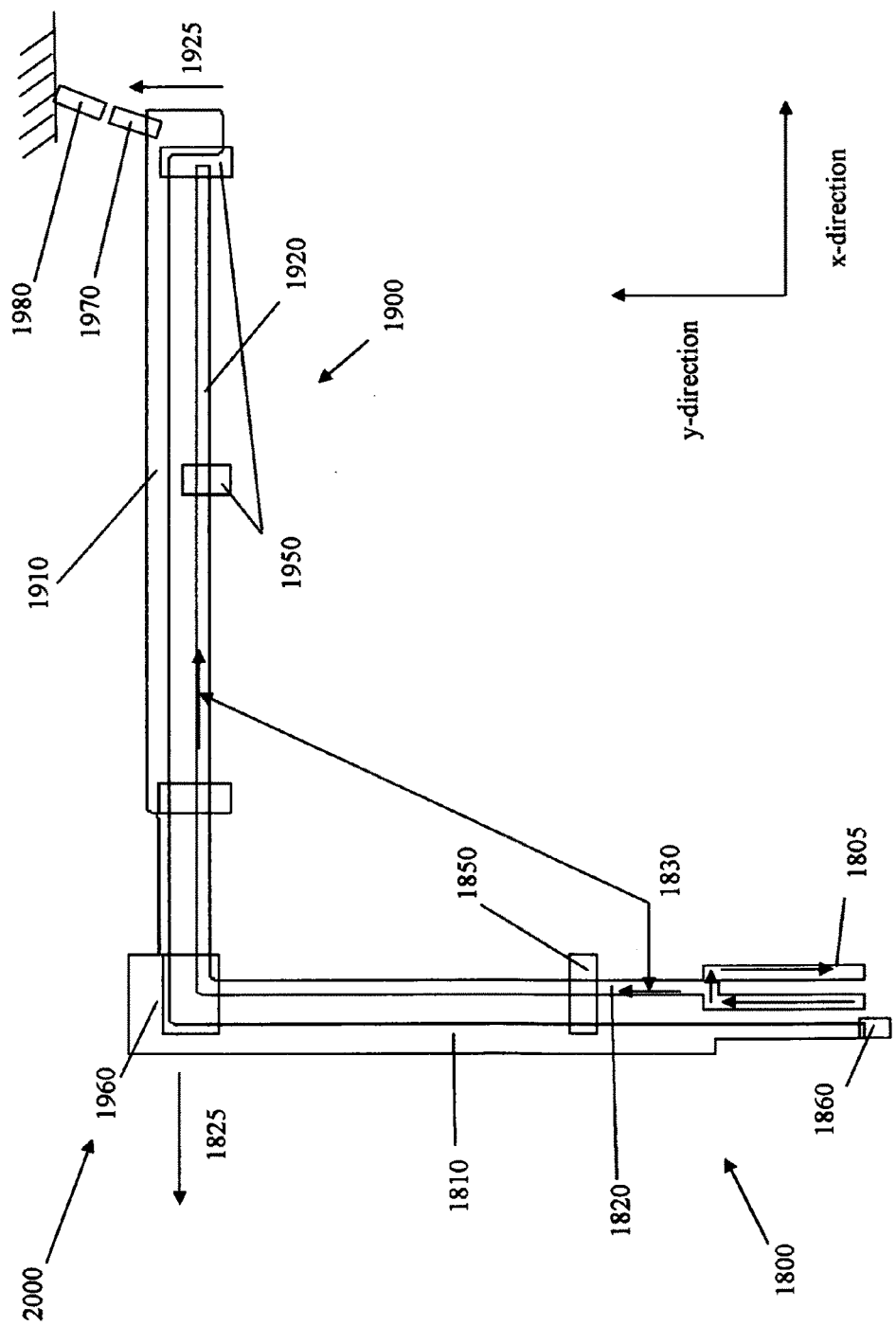
FIG. 10 is a diagram illustrating a sixth exemplary embodiment of a MEMS hysteretic thermal actuator, in which a heat source is disposed at the base of a heat conductor which conducts the heat to the tip of the thermal actuator.

FIG. 10 is a diagram illustrating a sixth exemplary embodiment of the MEMS hysteretic thermal actuator 2000. Like the previous embodiments, MEMS hysteretic thermal actuator 2000 includes two beam portions 1800 and 1900 coupled by a substantially ninety-degree joint 1960. Each beam portion 1800 and 1900 includes a drive beam portion 1820 and 1920 and a passive beam portion 1810 and 1910, which are coupled by tethers 1850 and 1950, respectively. The drive beam portions 1820 and 1920 are formed from stiff, thermally conductive materials. Drive beam portion 1820 is in thermal communication with a circuit 1805, which generates heat at the base of the drive beam portion 1820. The heat generated by circuit 1805 is conducted by thermally conductive drive beam portion 1820 to thermally conductive drive beam portion 1920, causing drive beam portions 1820 and 1920 to heat up. Accordingly, the drive beam portions 1820 and 1920 are required to be thermally conductive, but may not be electrically conductive.

The heating of drive beam members 1820 and 1920 causes drive beam portions 1820 and 1920 to expand. The expansion of drive beam portion 1820 causes driven beam 1810 to bend about anchor point 1860 in the negative x-direction 1825. Similarly, the expansion of drive beam portion 1920 causes driven beam portion 1910 to bend about substantially ninety-degree joint 1960 in the positive y-direction 1925. Upon cooling, because of its proximity to the heat sink of electrical circuit 1805, the drive beam 1820 cools more rapidly than drive beam 1920, resulting in hysteretic behavior of the MEMS hysteretic actuator 2000. Accordingly, the behavior of MEMS hysteretic thermal actuator 2000 may be similar to that of MEMS hysteretic thermal actuator 500, and may be described by plots similar to those shown in FIGS. 4 and 5. A latching electrical switch may be made using MEMS hysteretic actuator 2000, by disposing contacts 1970 and 1980 as shown in FIG. 10.

Figure 11:
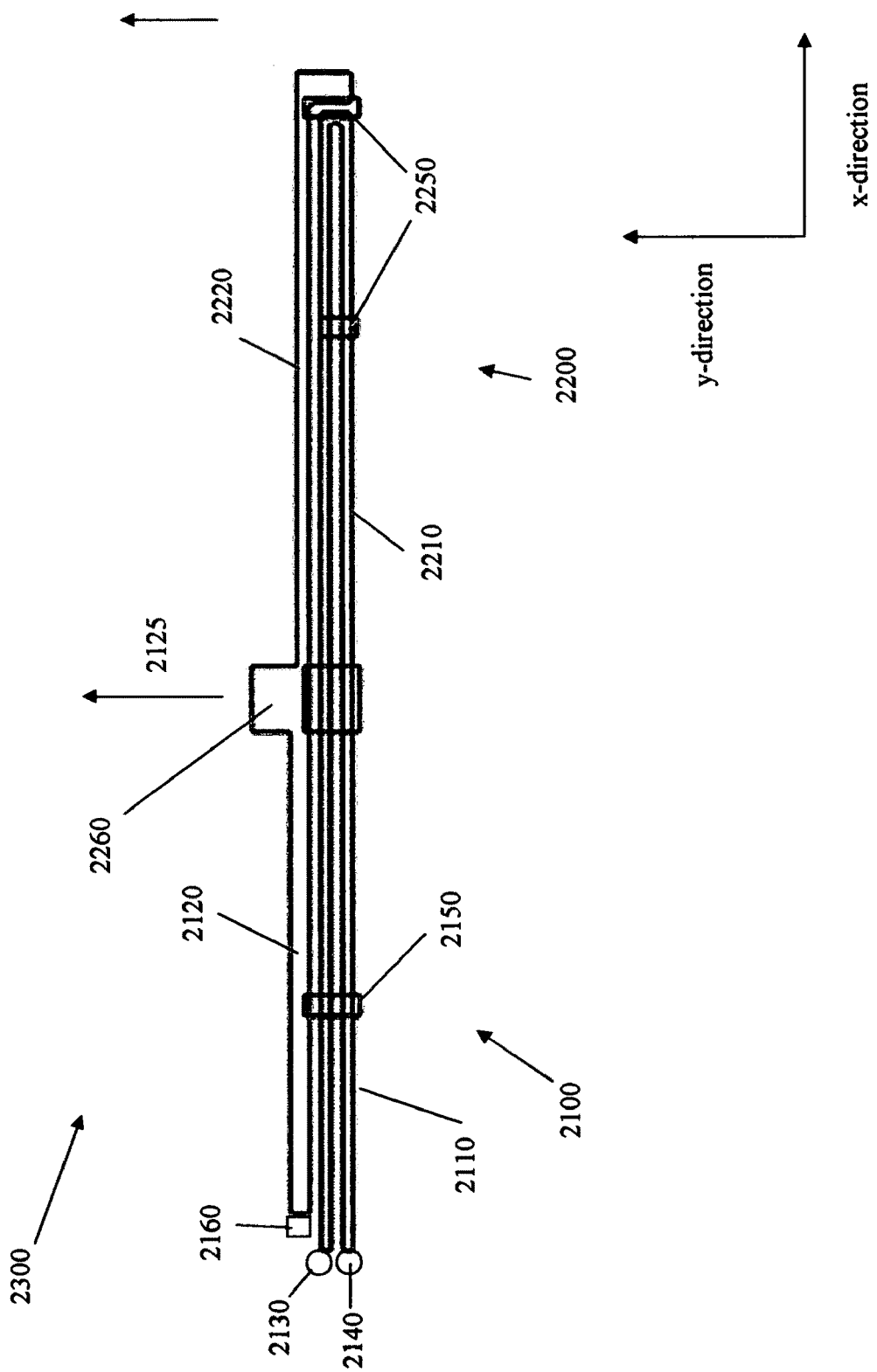
FIG. 11 is a diagram illustrating a seventh exemplary embodiment of a MEMS hysteretic thermal actuator, in which a first segment is coupled to a second segment by a rectilinear rigid link.

FIG. 11 is a diagram of a seventh exemplary embodiment of a MEMS hysteretic thermal actuator 2300. Like the previous embodiments, MEMS hysteretic thermal actuator 2300 includes two beam portions 2100 and 2200 coupled by a rigid link 2260. However, in this embodiment, the rigid link 2260 does not join the two beam portions 2100 and 2200 at a substantially ninety-degree angle. Instead, rigid link 2260 joins beam portion 2100 and 2100 in a rectilinear fashion Rigid link 2260 provides a distinct pivot point for beam portion 2200 compared to beam portion 2100, which may pivot about anchor point 2160. Accordingly, the presence of rigid link 2260 allows MEMS hysteretic actuator 2300 to move in two substantially different directions, with at least about a five degree angle between these directions. Each beam portion 2100 and 2200 includes a drive beam portion 2120 and 2220 and a passive beam portion 2110 and 2210, which are coupled by tethers 2150 and 2250, respectively.

Heat is generated in drive beam portions 2120 and 2220 by applying a voltage between contacts 2130 and 2140. Current flows in drive beam portions 2120 and 2220 as a result of the voltage, which heats drive beam portions 2120 and 2220 by joule heating. Drive beam portions 2120 and 2220 expand because of their increased temperature. Because drive beam portions 2120 and 2220 are tethered to passive beam portions 2110 and 2210 by tethers 2150 and 2250, the expansion causes passive beam portion 2110 to bend about anchor point 2160, and passive beam portion 2210 to bend about rigid link 2260. Upon cooling, the drive beam portion 2120 cools faster than drive beam portion 2220, because of its closer proximity to the heat sink of contacts 2130 and 2140. As a result, the motion of MEMS hysteretic thermal actuator 2300 is hysteretic, as the thermal profile of the MEMS hysteretic thermal actuator 2300 is different upon heating than it is upon cooling. By disposing contacts in the appropriate locations on MEMS hysteretic thermal actuator 2300, a latching electrical switch may be formed.

Although embodiments have been described wherein the first segment is joined to the second segment at an angle of about zero degrees (FIG. 11) and an angle of about ninety degrees (FIGS. 3 and 6-10), it should be understood that any other angle greater than or equal to about zero degrees and less than or equal to about ninety degrees may also be used in the MEMS hysteretic actuator.

Figure 12:
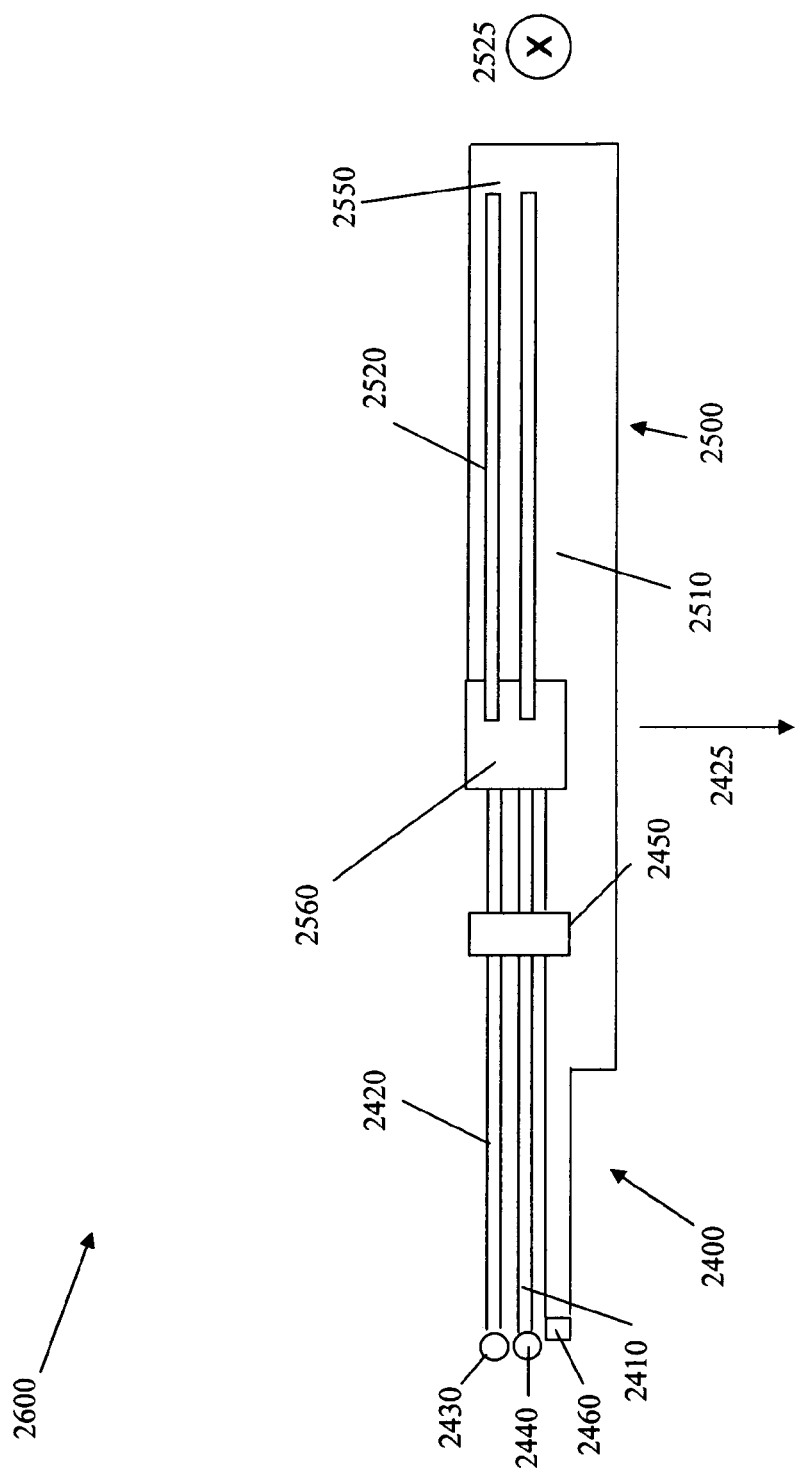
FIG. 12 is a side view of an eighth exemplary MEMS hysteretic thermal actuator, wherein the motion of a first segment is in one plane, and the motion of a second segment is in another, substantially orthogonal plane.
Figure 13:
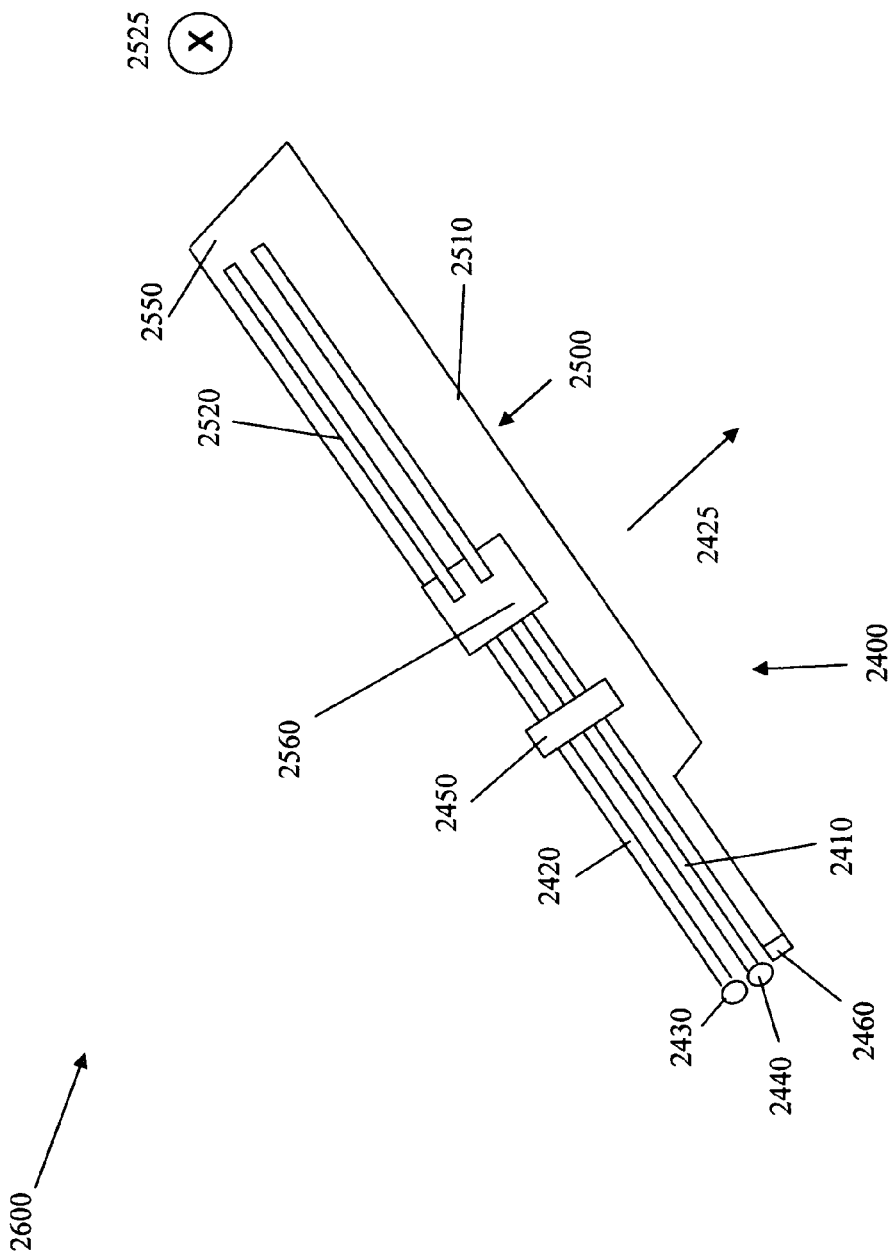
FIG. 13 is a perspective rendering of the MEMS hysteretic thermal actuator of FIG. 12.

FIG. 12 is a schematic side view of an eighth exemplary embodiment of a MEMS hysteretic thermal actuator 2600. Like the previous embodiments, MEMS hysteretic thermal actuator 2600 includes two beam portions 2400 and 2500 coupled by a rigid link 2560. Each beam portion 2400 and 2500 includes a drive beam portion 2420 and 2520 and a passive beam portion 2410 and 2510, which are coupled by tethers 2450 and 2550, respectively. However, in this embodiment, drive beam portions 2420 and 2520 are disposed such that they drive the driven beam portions 2410 and 2510 in two different planes. In particular, drive beam portion 2420 is oriented to bend passive beam portion 2410 about fixed anchor point 2460 in direction 2425, indicated in FIG. 12. Drive beam portion 2520 is oriented to bend passive beam portion 2510 about the rigid link 2560 in the direction 2525, which is into the paper as indicated in FIG. 12. Accordingly, MEMS hysteretic thermal actuator has one component bending in the plane of the paper, and another component bending in a plane orthogonal to the paper. Like the previous embodiments, current is input to drive beam portions 2420 and 2520 by applying a voltage between contacts 2430 and 2440. The current heats the drive beams by joule heating, and the resulting expansion of the drive beam portions 2420 and 2520 causes the bending of the passive beams 2410 and 2510 described above. The contacts 2430 and 2440 also provide a heat sink for the drive beam portions 2420 and 2520. Accordingly, drive beam portion 2420 located nearer to heat sink contacts 2430 and 2440 cools more quickly than drive beam portion 2520 located farther from heat sink contacts 2430 and 2440. Therefore, the motion of MEMS hysteretic thermal actuator 2600, like MEMS hysteretic thermal actuators 500-2300 is hysteretic between the heating phase and the cooling phase. FIG. 13 is a perspective view of the eighth exemplary embodiment described above.

One of the issues with the eighth exemplary embodiment of MEMS hysteretic thermal actuator 2600 is difficulty of manufacturing. As shown in FIG. 13, in the first segment 2400 of MEMS hysteretic thermal actuator 2600, the cantilevered drive beams 2420 are disposed adjacent to the passive beam portion 2410, whereas in the second portion 2500 of MEMS hysteretic thermal actuator 2600, the cantilevered drive beams 2420 are disposed above the passive beam portion 2510. Because of the orientations of the drive beam portions 2420 and 2520 with respect to the passive beam portions 2410 and 2510, the drive beam portions cannot be formed or deposited in a single step. This complicates the manufacturing process flow for making MEMS hysteretic thermal actuator 2600.

Figure 14:
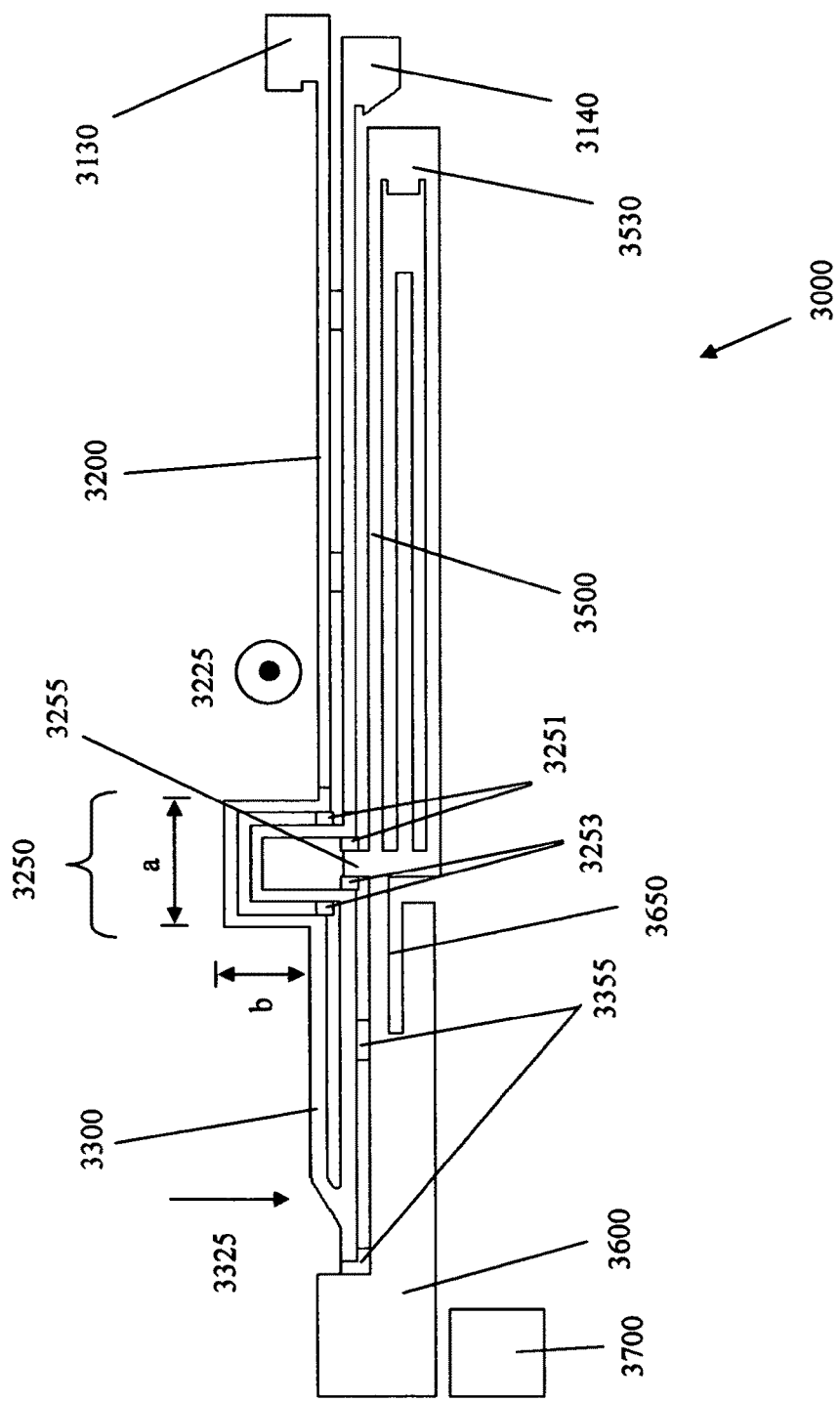
FIG. 14 is plan view of a ninth exemplary MEMS hysteretic thermal actuator, which moves in two substantially orthogonal planes.

FIG. 14 illustrates a ninth exemplary MEMS hysteretic thermal actuator 3000, which may be easier to manufacture than MEMS hysteretic thermal actuator 2600. MEMS thermal device 3000 is similar to hysteretic MEMS thermal device 2600, in that it is designed to move in two substantially orthogonal planes. In hysteretic MEMS thermal device 3000, the drive beam is separated into two segments, 3200 and 3300, which are separated by a flexure 3250. The flexure 3250 serves to decouple the motion in the two orthogonal planes, which motion is driven by a first segment 3200 and a second segment 3300. The first plane of motion is out of the plane of the paper, in direction 3225, as indicated in FIG. 14. This motion is produced by fabricating the cantilevered drive beam 3200 slightly below the plane of the passive beam segment 3500, relative to the substrate surface. That is, cantilevered drive beam 3200 is closer to the substrate surface than passive beam segment 3500. More generally, the driving beam segment 3200 may have an average elevation different than the average elevation of the passive beam segment 3500, wherein the average elevation is along the longitudinal axis of driving beam 3200. Accordingly, when cantilevered drive beam segment 3200 is heated by passing a current through cantilevered drive beam segment 3200 by applying a voltage to pads 3130 and 3140, it expands about the pads 3130 and 3140 anchored to the surface of the substrate. Because passive beam segment 3500 is not heated, it does not expand, so that cantilevered drive beam segment 3200 is forced to bend itself and passive beam segment 3500 upward, away from the substrate surface, about the anchor point 3530 of the passive beam segment 3500.

Then, the second segment 3300 of cantilevered drive beam begins to heat as the current is passes through it. It also expands as a result of the heat, and begins to move in direction 3325, bending passive beam segment 3600 in this direction. Cantilevered drive beam segment 3300 and passive beam segment 3600 move in direction 3325 because they are formed in the same plane, so that as cantilevered drive beam segment 3300 heats up, it bends toward the unheated passive beam segment 3600 in direction 3325. Accordingly, driving beam segment 3300 has an average elevation substantially the same as passive beam segment 3600.

At the joint between cantilevered drive beam segment 3200 and cantilevered drive beam segment 3300 is flexure 3250. The flexure 3250 consists of a length of the hot driving beam which bends away from and then back toward a knee 3255 in the passive beam, thus adding length to the hot driving beam. This additional length adds to the heat produced in the hot driving beam, by increasing its resistance. The amount of heat created within the flexure 3250 is larger than in the driving beam segments 3200 and 3300 because of the larger distance flexure 3250 is from the passive beam segments 3500 and 3600 which may act as radiative heat sinks. Therefore, the flexure 3250 acts as a heat choke, which impedes the flow of heat from the tip of the driving beam segment 3300 back to the anchor points 3130 and 3140, which act as the primary heat sink for the device. The presence of the flexure therefore enhances the hysteresis of the device, because heat built up in the tip of the driving beam segment 3300 has greater difficulty returning to the heat sink anchor point 3130 and 3140 than heat built up in the first driving beam segment 3200. It should be understood that additional lengths of driving beam may also be added to driving beam segment 3300 to increase the temperature at the distal end of MEMS hysteretic thermal actuator 3000, thus increasing the hysteresis of the actuator 3000.

In addition, flexure 3250 acts as a mechanical component to decouple the out-of-plane motion of the first beam segments 3200 and 3500, from the in-plane motion of the second beam segments 3300 and 3600. This function is provided primarily by the presence of dielectric spacers 3251 and 3253 between the driving beam segment 3200 and the knee 3255 of the passive segment 3500 and dielectric spacers 3355 between driving beam segment 3300 and passive segment 3600. Dielectric spacers 3253 act to transmit the out-of-plane torque produced by driving beam segment 3200 to passive beam segment 3500 by tethering the segments together at that point to bend the passive segment 3500 in direction 3225. Dielectric spacers 3251 act as an anchor for the bending of driving beam segment 3300 in direction 3325. The torque from driving beam segment 3300 is transmitted to the passive segment 3600 by dielectric spacers 3355, to bend the passive beam in direction 3325, at hinge flexure 3650.

In one exemplary embodiment, flexure 3250 may have a width a of about 48 μm and a height b of about 32 μm. The length of driving beam segment 3200 may be 270 μm, with a beam segment width of about 5 μm. The length of driving beam segment 3300 may be about 128 μm, so that the flexure 3250 is located about ⅔ of the distance between the anchor points 3130 and 3140 and the tip of driving beam segment 3300. However, it should be understood that these dimensions are exemplary only, and that other shapes and dimensions may be chosen depending on the requirements of the application. For example, the flexure 3250 may alternatively be located at about ⅓ or ½ of the distance between the anchor points 3130 and 3140 and the tip of the driving beam segment 3300.

Figure 15:
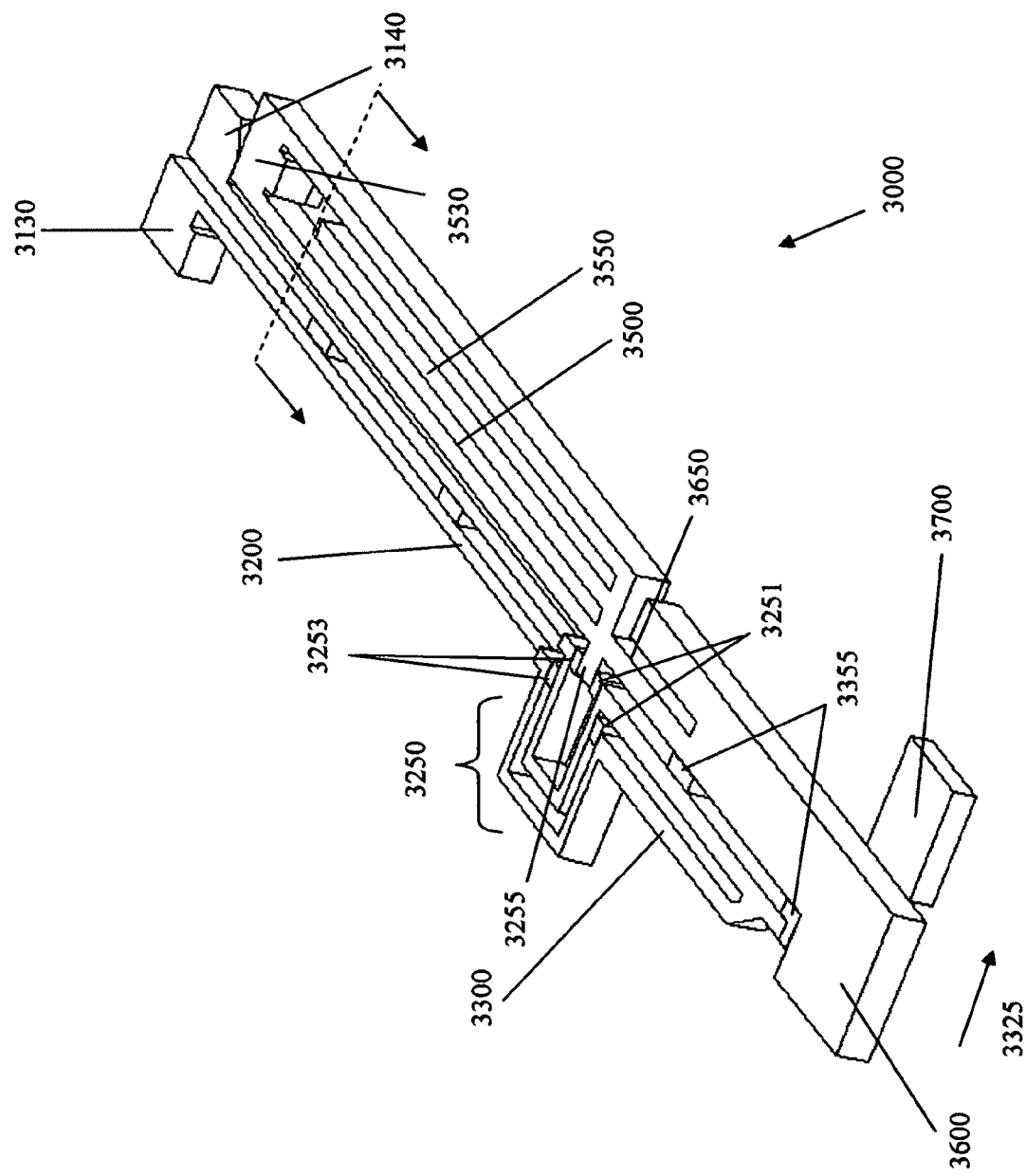
FIG. 15 is a perspective view of the ninth exemplary embodiment illustrated in FIG. 14.

FIG. 15 shows the ninth exemplary embodiment in perspective view, in which the construction of the ninth embodiment is more clearly evident. The first driving beam segment 3200 is fabricated on a lower plane than passive beam segment 3500. This allows the driving beam segment 3200 to bend the passive beam segment 3500 up and out of plane. In contrast, driving beam segment 3300 is in the same plane as passive segment 3600, in order to bend passive segment 3600 in the same plane as driving beam segment 3300. Thus, a step up occurs in the driving beam between driving beam segments 3200 and 3300. This step up may occur adjacent to dielectric tethers 3253, as the driving beam segment 3200 enters flexure region 3250. Accordingly, passive beam segments 3500 and 3600 may all be in the same plane, allowing the cool, passive beam segments 3500 and 3600 to be formed in a single process step, and simplifying manufacturing. Similarly, the driving beam segments 3200 and 3300 are all formed on the same side of passive beam segments 3500 and 3600, allowing the driving beams segments to be formed in a single deposition step, as described below.

Some additional features shown in FIG. 15 give the ninth exemplary embodiment several advantageous characteristics. First, passive beam segment 3600 has a relieved, hinged area 3650, which gives it additional flexibility to bend in direction 3325. Secondly, passive beam segment 3500 has a rectangular box shape. This gives passive beam segment 3500 a high moment of inertia in the in-plane direction but a low moment of inertia in the out of plane direction. This configuration enhances the ability of MEMS hysteretic thermal actuator 3000 to move out of plane rather than in-plane.

Additional structures, such as heat sink 3550 may be added to passive beam segment 3500 to assist with transferring heat through conduction, convection, and radiation away from passive beam segment 3500. The temperature difference between driving beam segment 3200 and passive beam segment 3500 may be proportional to the magnitude of out of plane movement that can be achieved. Heat may be transferred to passive beam segment 3500 from driving beam segment 3200 and the insulators 3253. Passive beam segment 3500 does not have a good thermal conduction path to anchor 3530 due to its thin width required to lower the out of plane stiffness. Additional heat sink 3550 may be added to increase the area of passive beam segment 3500 that can transmit heat without changing the stiffness. If more in-plane stiffness is required, heat sink 3550 can be designed to triangulate the box shape and increase the in-plane stiffness significantly more than the out of plane stiffness. These features thus enhance the ability of MEMS hysteretic thermal actuator 3000 to move out of plane rather than in-plane. Thus, the out-of-plane motion of passive beam segment 3500 is effectively decoupled from in-plane motion of passive beam segment 3600 by structures 3550 and 3650, as well as by flexure 3250.

The hysteretic effect in the ninth exemplary embodiment of MEMS hysteretic thermal actuator 3000 arises from the same effect as for MEMS hysteretic thermal actuators 500-2600. The hysteresis arises from the proximity of the primary heat sink to one of the segments of MEMS hysteretic thermal actuator 3000. This cools the segment nearest the heat sink faster than the segment further away from the heat sink, whereas during heating, the two segments are heated relatively uniformly. In the case of MEMS hysteretic thermal actuator 3000, both segments 3200 and 3300 are heated relatively uniformly, moving the tip 3600 diagonally away from the surface of the paper, up from the surface of the paper because of driving beam segment 3200 and downward in direction 3325 because of the action of driving beam segment 3300. However, upon cooling, driving beam segment 3200 cools faster than driving beam segment 3300, because of its closer proximity to heat sinking anchor points 3130 and 3140. MEMS hysteretic thermal actuator 3000 may therefore move back toward the substrate surface before relaxing back in the upward direction, opposite to direction 3325. Accordingly, because MEMS hysteretic thermal actuator moves through different points upon heating as it does upon cooling, MEMS hysteretic thermal actuator has a different trajectory upon activation, for example upon heating, than it does upon relaxation, for example upon cooling. For this reason, MEMS hysteretic thermal actuator 3000 may be used to rise up and over a stationary contact 3700, landing on the contact at the end of a latching pulse and remaining there because of frictional forces, or by forming a détente structure on the contact. The MEMS hysteretic thermal actuator 3000 may then be unlatched by applying a current pulse of appropriate amplitude and duration.

MEMS hysteretic thermal actuator 3000 may have a number of disadvantages, however, one being the use of dielectric tethers 3251 and 3252. The dielectric tethers 3251 and 3253 isolate electrically the current-carrying drive beam segments 3200 and 3300 from the signal carrying passive beam segments 3500 and 3600. Dielectric tethers 3251 and 3252 may be made of a polymer base material which may possess viscoelastic properties which change shape after repeated heating and cooling. These viscoelastic properties may cause the device to creep after some number of temperature cycles, which may change the magnitude of the contact gaps and the contact forces. These changes may cause unreliable functioning of the actuators with age or use.

Another problem of MEMS hysteretic thermal actuator 3000 may be control of the actuator during latching. Because of process tolerances and manufacturing tolerances on the dimensions of the actuator, the drive current required to latch and unlatch the switch may vary among a population of like switches. While the switches could be characterized individually or in a group, this adds manufacturing cost and complexity. Another approach is to use a nominal current for all devices, however this may cause some devices to be overdriven and others not to achieve latch. Either result may be seen as reliability issues with the actuators.

FIGS. 16a and 16b show a tenth exemplary embodiment of a MEMS hysteretic thermal actuator 4000 which may ameliorate the above problems. MEMS hysteretic thermal actuator 4000 may be a single material device, wherein each of the beams which make up the actuator is made from the same material. The MEMS hysteretic thermal actuator relies on an independent heating element 5000 disposed on the substrate adjacent to the MEMS hysteretic thermal actuator 4000, to actuate the device. MEMS hysteretic thermal actuator 4000 and adjacent heating element are shown in the quiescent (unactivated) position in FIG. 16a. The independent heating element 5000 may be a resistive heater disposed on the substrate surface, through which a current is driven to generate Joule heat. Since the heat is provided by an element already electrically separated from the MEMS hysteretic thermal actuator 4000, there is no need to include the dielectric tethers in MEMS thermal actuator 4000, to provide electrical isolation between the heating element 5000 and the signal carrying element. This eliminates one of the technical hurdles in designing an electrical switch using the MEMS hysteretic thermal actuator 4000 with reliable performance and little or no creep. As described below, the MEMS hysteretic thermal actuator 4000 may be used in the design of an electrical switch, or it may be used in any other application, such as to activate a valve or piston, wherein its hysteretic motion is useful. It may also be used to design a variable optical attenuator, as described in greater detail below.

MEMS hysteretic thermal actuator 4000, like MEMS hysteretic thermal actuator 3000, includes a plurality of beams with their neutral axes disposed in different elevational planes relative to the fabrication substrate, which may drive MEMS hysteretic thermal actuator 4000 in a direction neither substantially parallel to nor perpendicular to, the surface of the fabrication substrate. The MEMS hysteretic thermal actuator 4000 may comprise at least three beams, 4100, 4200 and 4300. One of these beams 4100 is the passive beam, i.e. the component which is driven by the other components and opens or closes a switch, activates a valve, or drives a piston, for example, depending on the application to which the actuator is directed. The other two beams 4200 and 4300 are driving beams, which drive the passive beam 4100 upon being heated by the adjacent heating element 5000. In the unheated quiescent state, the passive beam 4100 may have its neutral axis in a plane parallel to the substrate surface. In the unheated, quiescent state, the neutral axis of at least one of the drive beams 4200 and 4300 may be disposed in a different elevational plane than the neutral axis of the passive beam 4100. As used herein, the term "neutral axis" should be understood to mean the axis running along the length of the beam and through the centroid of the cross section of the beam structure. For example, in FIG. 16a, the neutral axis of beam 4200 is disposed in a plane below that of passive beam 4100. This beam may cause deflection of the passive beam out of the plane parallel to the substrate, upon being heated by the adjacent heating element 5000. Thus, the function of beam 4200 is similar to that of beam 3200 driving passive beam 3500 out of plane in MEMS hysteretic thermal actuator 3000.

The neutral axis of beam 4300 may be disposed in the same plane as that of passive beam 4400, and drives beam 4400 laterally in a plane parallel to the substrate upon being heated by the heating element 5000. The combination of in-plane drive beam 4300 and out-of-plane drive beam 4200 causes the passive beam 4100 to be driven at an angle of about 45 degrees upon being heated by the heating element 5000. The disposition of these beams 4100, 4200 and 4300 are shown more clearly in the cross sections of FIGS. 19a-19c.

The driving beams 4200 and 4300 and the passive beam 4100 may all be anchored at their proximal ends to the substrate by anchor points 4250 and 4150. All three beams, 4100, 4200 and 4300 may be mechanically coupled together at or near their distal ends. As used herein, the terms "at or near the distal end" should be understood to designate a point closer to the distal end than the proximal end of a cantilevered beam. Beams 4200 and 4300 may also be joined at anchor point 4250. Thus, being constrained at both ends, the expansion of drive beams 4200 and 4300 causes the bending motion of passive beam 4100 about its anchor point 4150.

MEMS hysteretic thermal actuator 4000 may have an additional structure 4400, located substantially over the heating element 5000 when the actuator is in the quiescent state. The function of structure 4400 is primarily as a heat collector, to absorb the heat by convection that is generated in the heating element 5000, and transfer it to the driving beam 4300 during the heating phase.

Anchor points 4150 and 4250 may also serve as thermal ground for the device. The anchor point 4250 will be partially connected to thermal ground by creating a thermal insulator between anchor point 4250 and thermal ground. Thus, during the heating phase, heat enters the device via convection to the heat fin 4400, and drive beams 4300 and 4200. During the cooling phase, heat leaves the device mainly through the anchor point 4150 and partially through anchor point 4250. Since heat leaves the device 4000 by a different route than it enters the device, the motion of the device may be hysteretic, that is, the tip of the MEMS hysteretic thermal actuator 4000 may follow a different trajectory during heating than it does during cooling. The design and orientation of these beams and the path of the heat flows will be described in greater detail with respect to FIGS. 18 and 19a-19c, as discussed below.

FIG. 16b shows the MEMS hysteretic thermal actuator 4000 being deflected by heat transferred from the heating element 5000 disposed adjacent to MEMS thermal actuator 4000. As shown in FIG. 16b, the passive beam 4100 may have a narrowed portion 4140 near its anchor point 4150. This narrowed portion may give the passive beam greater flexibility to bend in response to the forces exerted by beams 4200 and 4300. Upon activation of heating element 5000, the heat generated in heating element 5000 is transferred to the heat fin 4400, driving beam 4300, and driving beam 4200. Because these beams are coupled to the passive beam at their distal ends, the thermal expansion of these beams drives the passive beam 4100 up and to the right, as shown in FIG. 16b.

The cooling mechanism of the MEMS hysteretic thermal actuator 4000 is fundamentally different than the heating mechanism. Most of the heat is dissipated through the anchor points 4150 and 4250, rather than back to the heating element 5000. The passive beam 4100 having a relatively large cross sectional area compared to beams 4200 and 4300 and being coupled directly to the substrate through conductive anchor point 4150 cools very quickly to a nominal temperature. Out-of-plane beam 4200 and in-plane beam 4300 are also coupled to the substrate but will cool more slowly due to the thermal insulator between the substrate and anchor point 4250. Beam 4200 will cool faster than beam 4300 because it has better thermal coupling to the passive beam 4100 because the connection at the distal end is shorter in length than beam 4300. Beam 4300 will also cool more slowly because it is coupled to the heat fin 4400 which is not thermally grounded and is still located at least partially over the heating element 5000, which although deactivated, may have some residual heat. The heat fin 4400 will act as a thermal capacitor and store the thermal energy and release it through beam 4300 as it cools. Accordingly, the elevation of the tip of the passive beam drops before it moves laterally back toward its initial position. This asymmetry in heating and cooling thus gives MEMS thermal actuator 4000 substantial hysteresis in its heating trajectory relative to its cooling trajectory. If "trajectory" is defined as the set of points in space through which the tip of the passive beam 4100 passes, the trajectory of the tip through the heating phase is substantially different than the trajectory of the tip during the cooling phase. This hysteresis is illustrated by the plot shown in FIG. 17.

Figure 17:
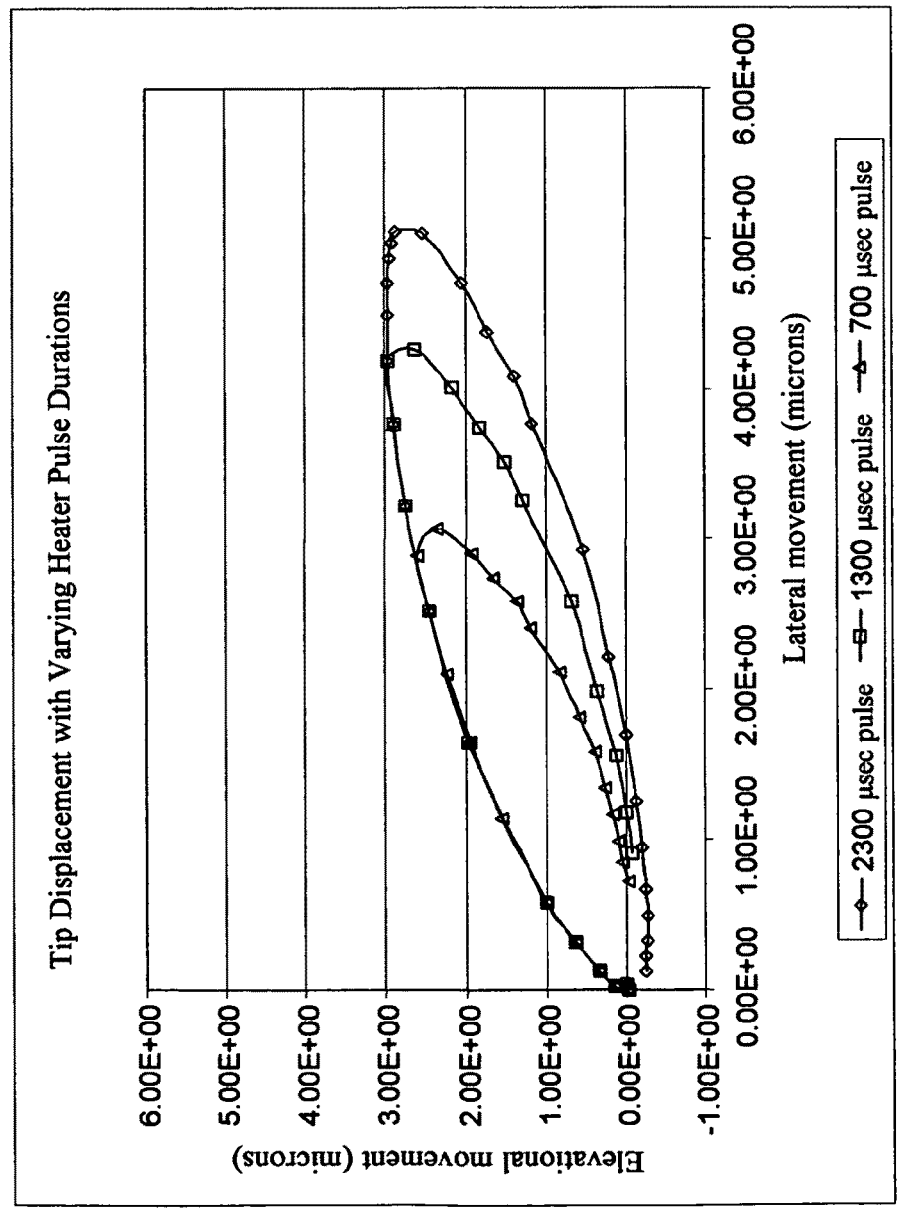
FIG. 17 is a plot of the trajectories of the tip of MEMS hysteretic thermal actuator using varying pulse lengths to the heating element.

FIG. 17 is a plot of the location of the tip of passive beam 4100 as a function of time for three different current pulses input to the heating element 5000, of duration 700 μsec, 1300 μsec and 2300 μsec. As seen in FIG. 17, the heating trajectories for all three pulse durations are qualitatively the same, although the maximum displacement for the longer pulses is greater than that of the shorter pulses, as would be expected. All three also show substantial hysteresis, as the tip of the actuator 4000 drops in elevation before being retracted laterally across the face of the substrate. The term "substantial hysteresis" should be understood to mean that the value of the elevational coordinate (the out-of-plane movement) at the same lateral location (in-plane movement) may be at least about 20% different during the heating phase than the cooling phase. In the plot shown in FIG. 17, for a lateral position of 2 μm, the elevational coordinate is about 100% higher (over 2 μm) in the heating phase than in the cooling phase (less than 1 μm).

As shown in FIG. 17, the tip of the MEMS hysteretic thermal actuator moves at an angle of about 45 degrees with respect to the substrate surface, as both the in-plane drive beam 4300 and out-of-plane drive beam 4200 and heat fin 4400 are heated by the heating element. As the MEMS hysteretic thermal actuator 4000 moves up and to the right, the out-of-plane drive beam 4200, located next to the passive beam 4100 is no longer located above the heating element, and thus is not heated as effectively as the in-plane drive beam 4300 and heat fin 4400, which are still located over the heating element. Therefore, as the pulse length becomes longer and larger excursions are reached, the motion of the MEMS hysteretic thermal actuator becomes primarily lateral, across the face of the substrate, driven primarily by the in-plane drive beam 4300. The maximum excursion of a device which is 440 um long is expected to be about 5 μm laterally and just under 3 μm in elevation.

The plot shown in FIG. 17 suggests that the system may be used to form a latching actuator by providing a stationary contact on the substrate having some finite height over which the tip may pass during the heating phase, but which prevents the movement of the actuator 4000 back to its original position during the cooling phase. If the contacts are electrically conducting, the latching actuator may form an electrical switch. Alternatively, the MEMS hysteretic thermal actuator 4000 may be used to activate any other mechanism, such as a piston or valve, or to block a beam of light, for which the two-dimensional hysteretic motion is useful.

FIG. 18 shows an embodiment of the MEMS hysteretic thermal actuator 4000 combined with a stationary electrical contact to form an electrical switch. As in FIG. 16, the MEMS hysteretic thermal actuator 4000 has at least four components: a passive beam 4100 which carries the electrical signal to be switched; an out-of-plane driving beam 4200 whose neutral axis is disposed in a lower elevational plane than the passive beam 4100; an in-plane driving beam 4300 whose neutral axis is disposed in substantially the same plane as the passive beam 4100 which drives the passive beam laterally in the plane; and a heat fin 4400 which collects heat from the adjacent heating element 5000 (not shown in FIG. 18). The MEMS hysteretic thermal actuator 4000 may have a moving electrical contact 4500 disposed at or near its distal end, which clears in elevation the height of a stationary contact 4600 disposed on the substrate, during the heating phase, but is latched on the stationary contact 4600 during the cooling phase.

As in previous illustrations 16a and 16b, the passive beam 4100 may have a narrowed portion 4140, which may decrease the overall stiffness of the passive beam 4100 to bending. In one exemplary embodiment, the narrowed section may be 9 μm wide, whereas the remainder of the passive beam may be about 20 μm wide, 440 μm long and 10 μm thick. In-plane drive beam 4300 may be 10 μm wide, 10 μm thick and 440 μm long. Out-of-plane drive beam 4200 may have a neutral axis located 4 µm below the neutral axis of in-plane drive beam 4300 and passive beam 4100. Out-of-plane drive beam 4200 may be 5 µm wide, 10 µm thick and 440 µm long. Heat fin 4400 may be formed in the same plane as either in-plane drive beam 4300 and passive beam 4100 or the out-of-plane drive beam 4200, and may be coupled to in-plane drive beam 4300 by a thin isthmus 4450 midway along its length.

It should be understood that the embodiment shown in FIG. 18 and described above is exemplary only. For example, the moving contact 4500 need not be disposed on the distal end, but may be placed anywhere else along the length of the MEMS hysteretic thermal actuator 4000. In one exemplary embodiment, the moving contact 4500 may be placed about 100 µm further inboard, i.e., closer to the proximal anchor points 4150 and 4250 in order to increase the amount of force between the surfaces of the contacts 4500 and 4600. This may reduce the contact resistance of the junction, and therefore the loss of the switch, and make the switch less likely to become dislodged during shock or vibration.

FIGS. 19a-19c show the construction of the actuator 4000 shown in FIG. 18 through various cross sections of the actuator 4000. FIG. 19a shows a cross section through the tip of the actuator 4000, and through electrical contacts 4500 and 4600. The cross sections show the different elevations of the out-of-plane drive beam 4200, along with the in-plane drive beam 4300, and the heat fin 4400.

Also shown in FIG. 19a is the construction of the stationary contact 4600. The stationary contact 4600 may be constructed with a tip which interferes with a complementary tip on moving contact 4500 to close the switch. The interaction of the moving contact 4500 and the stationary contact 4600 is shown in greater detail in FIGS. 20a-20j, described below. In the quiescent state shown in FIG. 19a, the tip of the moving contact 4500 is lower than the plane of the tip on the stationary contact 4600. Thus, in order to close the switch with actuator 4000, the tip of the moving contact 4500 will have to be lifted up and over the tip of the stationary contact 4600.

FIG. 19b is a cross section showing the construction of the MEMS thermal cantilever 4000 through its midsection. In this area, the heat fin 4400 may be connected to the in-plane drive beam 4300 by a thin isthmus of material 4450. Because this isthmus of material is thin, it does not contribute a large amount of stiffness to the in-plane drive beam 4300. Yet the isthmus of material 4450 is thick enough to effectively couple the heat fin 4400 thermally to the in-plane drive beam 4300. The heat fin is wide relative to beam 4300, and thus is efficient in absorbing the thermal energy produced by the heating element 5000. Since, as described below, the heat fin 4400 is only connected to the drive beam 4300 in one location, the expansion of the heat fin 4400 due to heating is not coupled to the motion of the drive beam 4300. Thus, as it serves only as a heat collector, it may be advantageous to place it as close as practically possible to the heating element 5000.

As can be seen clearly in FIG. 19b, the heat fin 4400 and out-of-plane drive beam 4200 may be located in a plane beneath the plane of the passive beam 4100. In the case of the heat fin 4400, this proximity to the heating element 5000 on the substrate 4700 below may improve the thermal coupling of the heating element 5000 to the heat fin 4400, and thus improve the thermal efficiency of the device.

FIG. 19c is a cross section showing the construction of the MEMS hysteretic thermal actuator 4000 through its base. The cross section shows two anchor points, 4150 and 4250, which anchor thermal cantilevers 4100 and 4200, respectively. As out-of-plane drive beam 4300 is joined to in-plane drive beam 4200 at its base, anchor point 4250 also anchors out-of-plane drive beam 4300 to the substrate 4700. Anchor point 4250 is partially insulated from the thermally ground substrate by an insulating layer 4800. Anchor point 4150 may be disposed over a through waver via 4160, which may be formed through the substrate 4700. Methods for forming the through wafer via 4160 are described in greater detail in U.S. patent application Ser. No. 11/211,624 and U.S. patent application Ser. No. 11/482,944, each of which is incorporated herein by reference in its entirety. Anchor point 4150 and through wafer via 4160 may include an electrically conductive material, such that an electrical signal may be applied to the passive beam 4100 using through wafer via 4160.

The signal delivered to the passive beam 4100 using through wafer via 4160 may be delivered along passive beam 4100 to the moving contact 4500. When the switch is closed by activating the heating element 5000, the moving contact 4500 carried on the passive beam 4100 makes an electrical connection to the stationary contact 4600. The electrical signal may be delivered from the stationary contact 4600 to an output pad (not shown). The through wafer via 4160 may also provide thermal grounding to the backside of the substrate, which may have large electrical pads which efficiently dissipate the heat. Thus, the passive beam 4100 is well grounded thermally, and can dissipate its heat readily compared to the out-of-plane driving beam 4200 and the in-plane driving beam 4300.

The substrate may be covered with an insulating film 4800 which isolates the MEMS thermal actuator 4000 electrically from the substrate 4700. The insulating film may be, for example, a layer of silicon dioxide several microns thick which may be thermally grown over a silicon substrate.

Figure 20A:
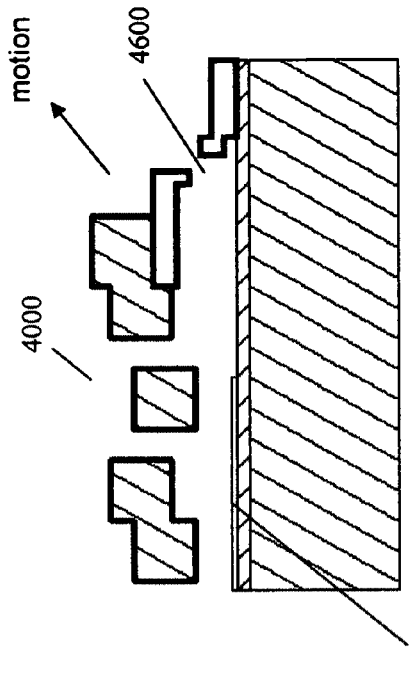
FIGS. 20a-20j are cross sectional views of the MEMS hysteretic thermal actuator at various steps during operation to open or close an electrical switch.
Figure 20B:
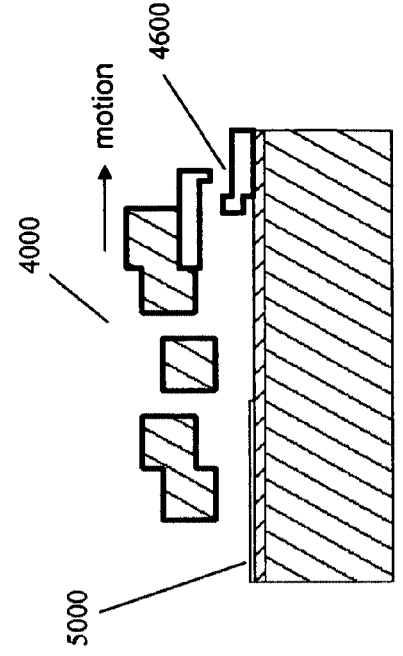

FIGS. 20a-20j illustrate the use of the MEMS hysteretic thermal actuator 4000 to close and open an electrical switch in the configuration shown in FIG. 18. FIG. 20a shows the components of the MEMS thermal actuator 4000 in their initial position, with the contacts of the switch apart and the switch open. In this initial configuration, the heat fin 4400, the in-plane beam 4300 and the out-of-plane beam 4200 may all be adjacent to, and over top of, the heating element 5000 disposed on the surface of the substrate 4700, whereas the passive beam 4100 extends beyond the edge of the heating element. When the heating element 5000 is activated, the heat produced may be delivered by convection to the heat fin 4400, the in-plane driving beam 4300 and the out-of-plane drive beam. The in-plane drive beam 4300 and the out-of-plane drive beam 4200 may be coupled to the passive beam at their distal ends. Therefore, as in-plane driving beam 4300 and out-of-plane drive beam 4200 heat up, they expand and bend the passive beam up and to the right, as shown in FIG. 20b.

Figure 20C:
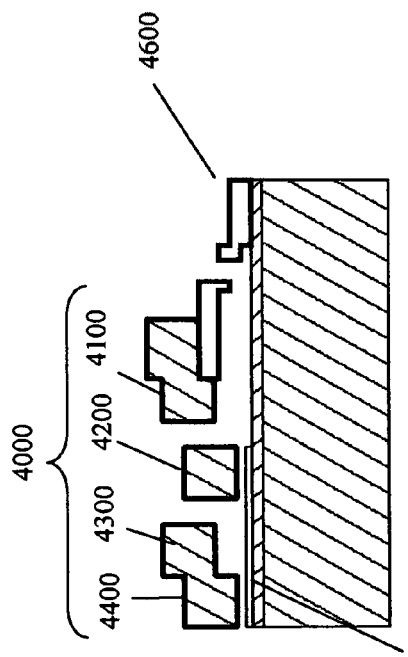
Figure 20D:
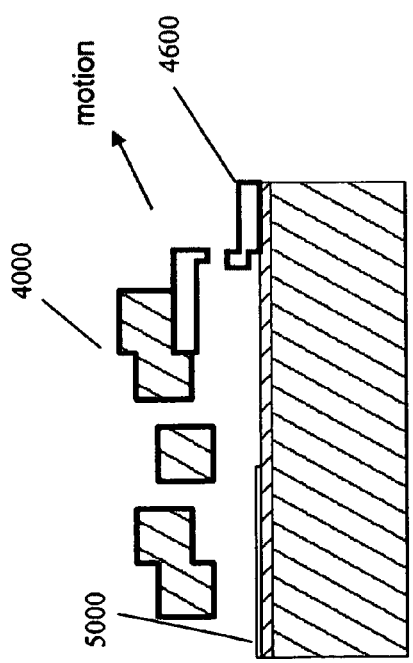

This motion continues until the out-of-plane drive beam 4200 has moved out and away from the heating element, as shown in FIG. 20c. At this point, the out-of-plane drive beam is no longer heated as effectively by the heating element 5000, although the in-plane drive beam 4300 and the heat fin are still disposed substantially over the heating element. As a result, the motion of the passive beam 4100 reaches its highest elevation over the surface of the substrate 4800. At this elevation, the tip of the contact 4500 formed on the distal end of the passive beam clears the protruding tip of the contact 4600 formed on the substrate. From this point onward, most of the motion of the passive beam 4100 is in this elevated plane, wherein it continues to be driven rightward by the in-plane drive beam 4300. As shown in FIG. 20d, the motion at this point is primarily a result of the still-expanding in-plane drive beam 4300, which is still absorbing heat from the heating element 5000 through its heat fin 4400, which is still located over the heating element 5000.

Figure 20E:
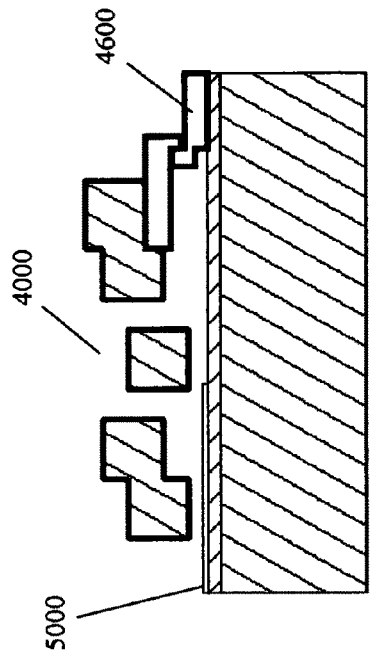

FIG. 20e illustrates the motion of the passive beam 4100 and moving contact 4500 upon cessation of the drive current to the heating element 5000. Since the passive beam 4100 is directly coupled to the thermal ground of the substrate 4800 and via 4160, most of the heat from the device exits through this path. That is, heat fin 4400, in-plane drive beam 4300 and out-of-plane drive beam 4200 are all cooled by dissipating their heat through the passive beam 4100 and via 4160. Beams closest to this thermal ground cool more quickly than those further away. As a result, the out-of-plane drive beam 4200 cools before the in-plane drive beam 4300, and shrinks accordingly. This shrinkage pulls the passive beam 4100 back toward the substrate 4800. The cooling and shrinkage of the in-plane drive beam 4300, then pulls the passive beam 4100 back towards the left. The motion of the moving contact 4500 on the tip of the passive beam is therefore down towards the substrate first and then back laterally across the surface of the substrate. This motion causes the tip of the moving contact 4500 to be latched against the tip of the stationary contact 4600, thereby closing the switch.

Figure 20F:
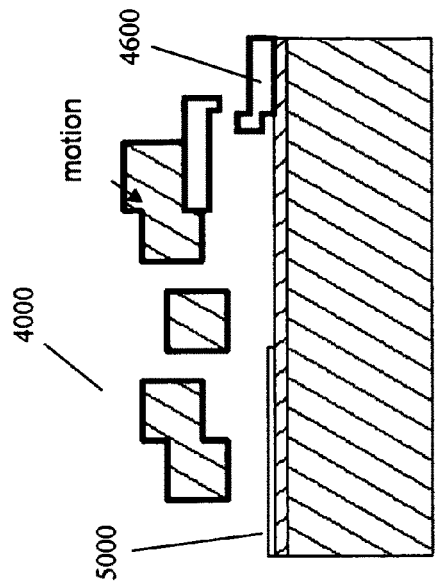

When the switch is in this closed configuration as shown in FIG. 20f, an electrical signal which is input (or output) to the signal via 4160 may be transmitted to a via disposed under the stationary contact 4600. The signal path is from the via 4160 down the passive beam 4100 to the moving contact 4500, across the junction to the stationary contact 4600 to an output (or input) signal via under the stationary contact. Since the contacts 4500 and 4600 may be formed of gold or a gold alloy, the resistance of the electrical switch junction may be quite low.

The switch may be opened by delivering a single short pulse of current to the heating element 5000. The opening sequence of the switch is illustrated in FIGS. 20g-20j. As the heating element 5000 heats up, it delivers heat once again to the heat fin 4400, in-plane drive beam 4300, and the out-of-plane drive beam 4200. As these beams expand due to the increasing temperature they will begin to deflect the passive beam 4100 up and to the right. Since the passive beam in the latched position is deflected from its quiescent position the passive beam 4100 will initially not move as the beams expand. The normal and frictional forces the moving contact 4500 exerts on the stationary contact will reduce as the drive beams expand. The forces involved are shown in FIG. 21, and discussed below with reference to that figure. At a certain level of thermal expansion of the out-of-plane drive beam 4200, the downward forces the moving contact 4500 applies to the stationary contact 4600 will become an upward force. Since the frictional force has been substantially reduced by the in-plane drive beam 4300 urging the passive beam 4100 to the right, a relatively small upward force is required to dislodge the moving contact 4500 from the stationary contact 4600.

Figure 20G:
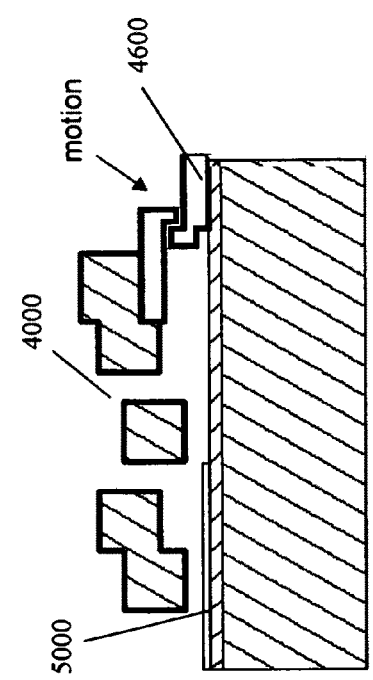
Figure 20H:
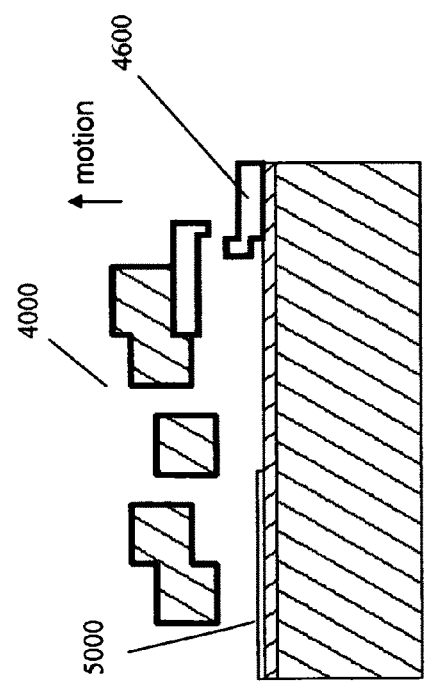
Figure 20J:
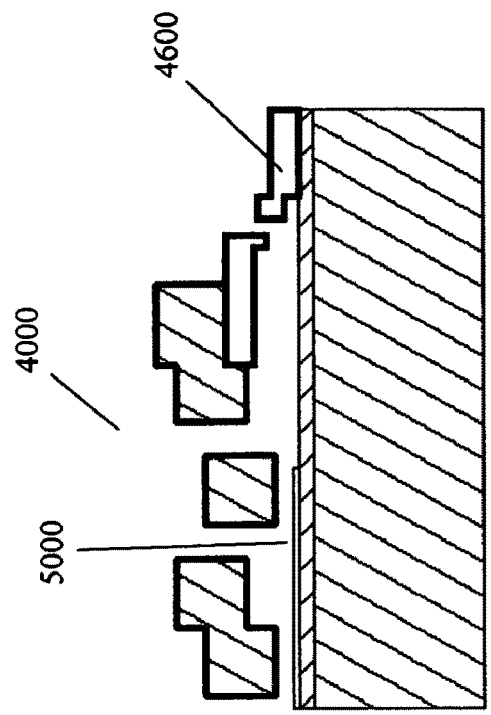
Figure 20I:
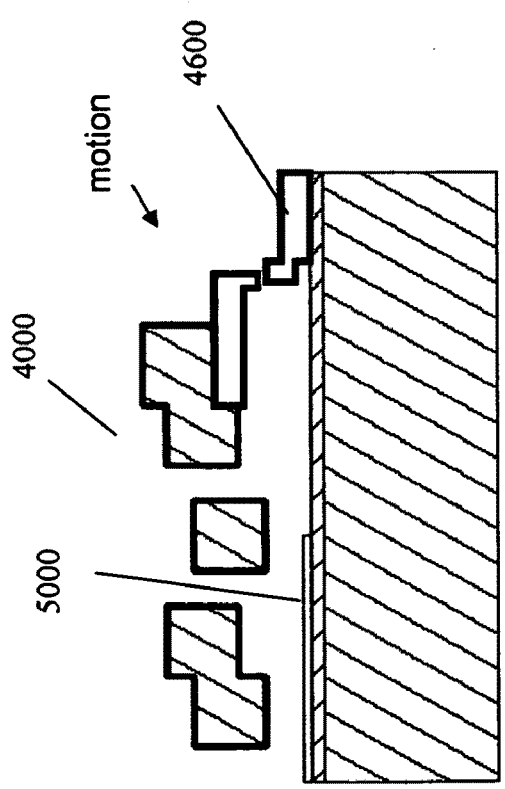
Figure 21:
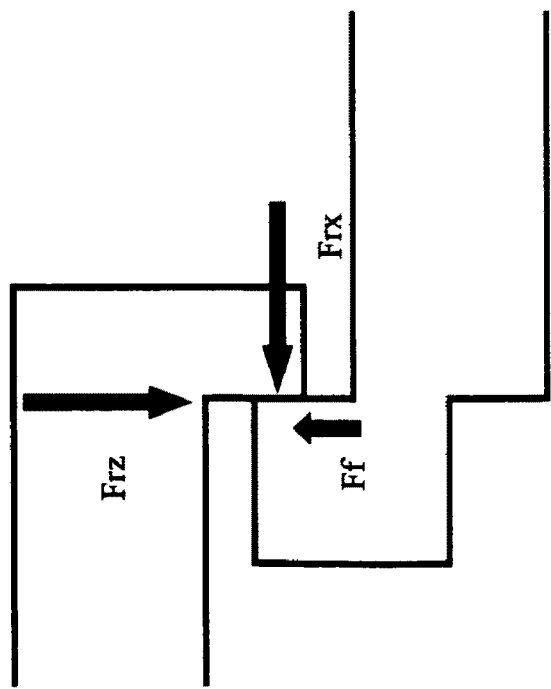
FIG. 21 depicts the forces acting on the contacts of the MEMS hysteretic thermal actuator when the actuator is used to close an electrical switch.

When the moving contact 4500 is freed from the stationary contact as shown in FIG. 20g, it moves to the point in the heating trajectory that corresponds to the appropriate value for the respective particular temperatures of the heat fin 4400, the in-plane drive beam 4300 and the out-of-plane drive beam 4200. This point is approximately with the tip of the moving contact 4500 directly above the tip of the stationary contact 4600, as shown in FIG. 20h. At this point of the shortened unlatching pulse, the current is discontinued to the heating element 5000, and the passive beam moves along its cooling trajectory. The trajectory is qualitatively that described above with respect to the latching current pulse: a descent in elevation followed by a movement to the left. However, the movement to the left may occur before the moving contact 4500 descends far enough to make contact with the stationary contact 4600, as shown in FIG. 20i. Accordingly, the contacts do not interfere and the passive beam 4100 may return to its quiescent position as shown in FIG. 20j.

The forces involved in maintaining the switch in the latched, closed position are shown in FIG. 21. There is an in-plane force $F_{rx}$ due to the restoring force of the passive beam 4100, out-of-plane beam 4200, in-plane beam 4300 trying to return the beam to its quiescent position. Similarly, there is an out-of-plane force $F_{rz}$ due to the restoring force of the passive beam 4100, out-of-plane beam 4200, in-plane beam 4300, also trying to return the passive beam to its quiescent position. The in-plane restoring force $F_{rx}$ generates a frictional force $F_f$ according to the friction coefficient of the contact material. In general, because the passive beam 4100 is wider than it is thick, and the latching position requires a greater lateral force than elevational force, the ratio of the in-plane restoring force $F_{rx}$ to elevational restoring force $F_{rz}$ is about 3 to 1. At closing, the passive beam moves the tip of the moving contact against the tip of the stationary contact. The tips come to rest at a point wherein the frictional force is greater than or equal to the out-of-plane restoring force $F_{rz}$. For a friction coefficient of 0.4, the frictional force is greater than the elevational restoring force when the passive beam is at an elevation of about 2 µm and the passive beam 4100 remains stationary in this position. The combination of these forces, $F_{rx}$, $F_{rz}$ and $F_f$ maintain the switch in the closed, latched position, even in the event of shock or vibration.

Figure 22:
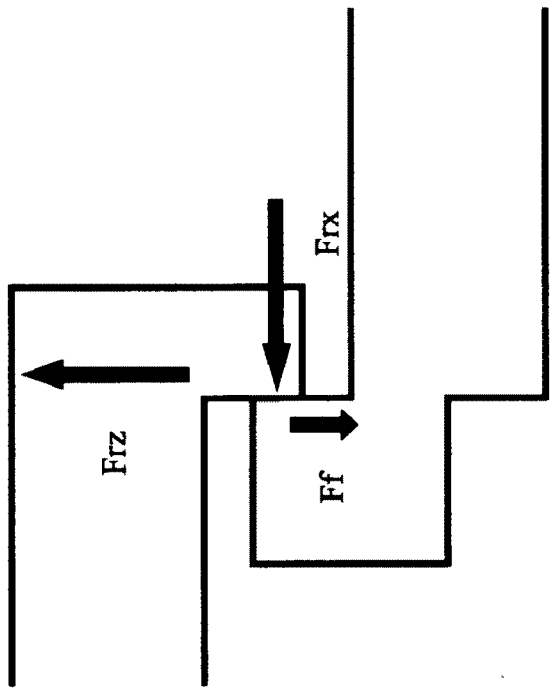
FIG. 22 depicts the forces acting on the contacts of the MEMS hysteretic thermal actuator 4000 when the actuator is used to open an electrical switch.

FIG. 22 illustrates the forces in effect during the unlatch process. As the in-plane drive beam 4300 and out-of-plane drive beam 4200 are heated by the heating element, the in-plane force against the contact $F_{rx}$ is reduced, which reduces the frictional force $F_f$ tending to keep the tips of the contacts 4500 and 4600 in a stationary position. At the same time, the heating out-of-plane beam 4200 begins to exert an upward pressure $F_{rz}$ on the passive beam 4100. When the out-of-plane force $F_{rz}$ exceeds the diminishing frictional force $F_f$, the passive beam begins to move upward carrying the moving contact 4500 with it. The passive beam moves to the appropriate point in its heating trajectory, with the tips of the contacts substantially above each other, at which point the heating current is suspended to the heating element 5000, and the beams 4000 return to their quiescent position. Modeling results show that the latching and unlatching pulses may both be a single value of current delivered to the heating element 5000, with the unlatch pulse generally having a shorter duration than the latching pulse. In this exemplary the latching pulse of 180 mA for 2.4 msec and an unlatch pulse of 180 mA for 0.85 msec. If a time-varying pulse profile is needed to achieve reliable latching and unlatching, the MEMS thermal actuator 4000 may easily be adapted to accommodate such a time-varying profile.

Figure 23:
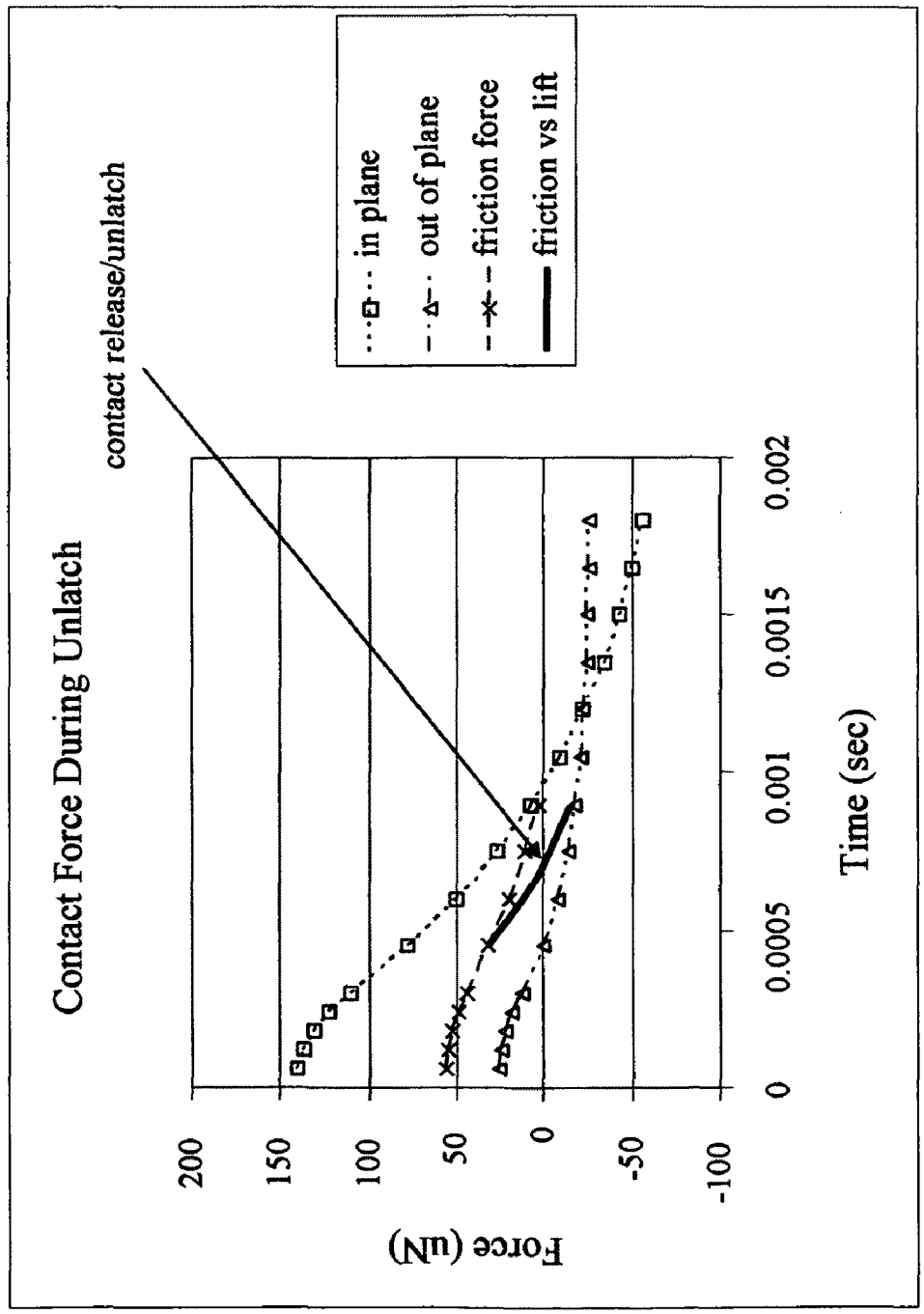
FIG. 23 is a plot comparing the magnitudes of the various forces depicted in FIG. 22, showing the crossover point at which the switch is opened.

FIG. 23 is a plot showing the magnitude of the various forces during the unlatch process. As shown in FIG. 23, before the unlatch pulse is applied to the heating element, the frictional force exceeds the out-of-plane force $F_{rz}$ by more than a factor of two, with the frictional force $F_f$ being over 50 µN and the out-of-plane (upward) force being about 25 µN. As the unlatch pulse is applied, the out-of-plane force $F_{rz}$ is reduced as the out-of-plane drive beam 4200 begins to urge the passive beam 4100 upward. After 0.5 msec, the out-of-plane force $F_{rz}$ is essentially zero, as the out-of-plane upward force cancels the natural restoring force of the bent beam. At this point, however, there is still about 35 µN of frictional force $F_f$ which resists the movement of the beams. As the unlatch sequence progresses, the out-of-plane force $F_{rz}$ changes sign and becomes an upward force tending to lift the moving contact 4500 from the stationary contact. When this upward force exceeds the frictional force, the tip begins to move upward. This is shown as the contact release/unlatch point at about 0.75 msec into the unlatch pulse. Between this point and the point at 1 msec, the in-plane force $F_{rx}$, is very nearly zero, with the in-plane restoring (left-ward) force approximately equal to the in-plane (right-ward) force delivered by in-plane drive beam 4300. Thus, the moving contact 4500 tip is moved nearly vertically off the stationary contact 4600.

Figure 24:
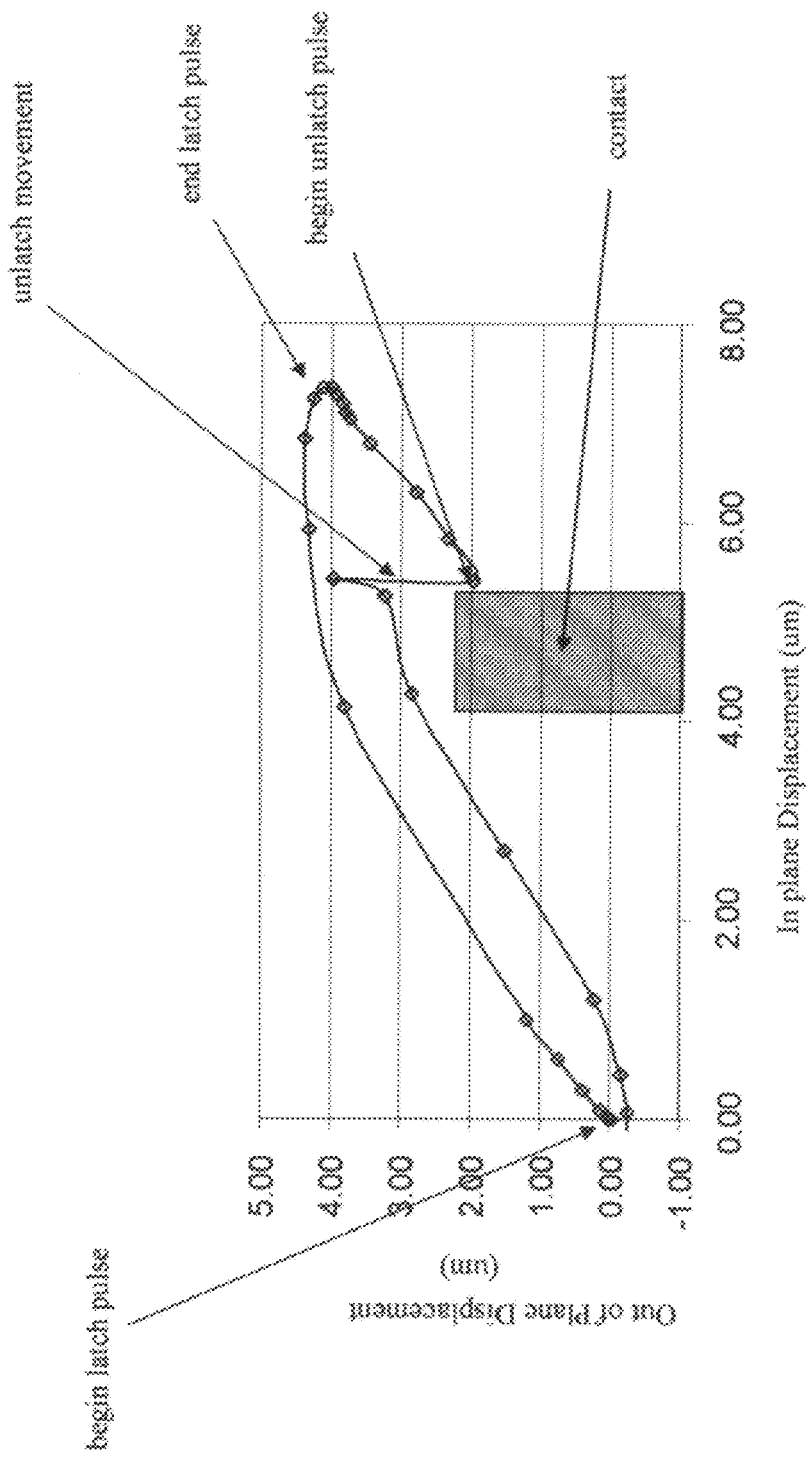
FIG. 24 is a plot showing the in plane and out of plane displacements of the tip of the MEMS hysteretic thermal actuator for different values of heater current pulse lengths.

The motion of the tip of the passive beam 4100 is shown graphically in the hysteresis trajectory of FIG. 24, through an entire latch/unlatch cycle. The elapsed time for the tip to reach the latched position the hysteresis trajectory is 2.8 msec. The elapsed time for the tip to unlatch and return to its quiescent position is 1.1 msec. This hysteresis trajectory is qualitatively the same as those shown in FIG. 17, and is a result of the same or similar actions of the in-plane drive beam 4300, out-of-plane drive beam 4200, and heat fin 4400. At the beginning of the latching pulse shown as t=0 on the chart, the tip of the passive beam begins to move at about a 45 degree angle, rising up away from the surface of the substrate at about the same rate as it moves laterally across the face of the substrate. This movement results from the heating and expansion of the in-plane drive beam 4300 and the out-of-plane drive beam 4200. This trajectory continues until the out-of-plane beam 4200 is essentially no longer over the heating element, and its temperature no longer rises, or rises only slowly. At this point, t=1.3 msec, the motion of the passive beam is almost entirely lateral, i.e., across the face of the substrate in a plane higher than its original elevation, and high enough to clear the tip of the stationary contact. This motion results from the continued heating of the heat fin 4400 and the in-plane drive beam, which are still located substantially over the heating element 5000.

When the latching pulse ends, the tip of the passive beam moves downward quickly, as a result of the out-of-plane beam 4200 being closer to the thermal ground than the in-plane beam 4300. Thus, the tip of the moving contact 4500 may fall beneath the height of the tip of the stationary contact 4600, and the tips interfere mechanically, closing and latching the switch. In-plane and out-of-plane restoring forces of the bent beams tend to keep the switch contacts locked together, even in the event of a shock or vibration, until an unlatch pulse is applied to the heating element 5000.

After some duration in the latched position, an unlatch pulse may be applied to the heating element 5000. As described above, the heating of the in-plane drive beam 4300 and out-of-plane drive beam 4200 proceeds to a point at which this upward force of the out-of-plane drive beam 4200 exceeds the frictional force arising from the in-plane restoring force against the tip of the stationary contact. At this point, the tip of the beam moves essentially vertically up the wall of the stationary contact and over it, at which point the unlatch current is discontinued and the beams are allowed to relax to their initial, quiescent position.

While the embodiment illustrated in FIG. 18 is that of an electrical switch with conducting contacts, it should be understood that this is exemplary only. The device may instead by used as a latching actuator, wherein the contacts 4500 and 4600 provide only a latching mechanism that restrains the movement of the MEMS hysteretic thermal actuator 4000 from returning back to its original position. In this case, the contact 4500 and 4600 may not be formed from gold or a gold alloy, and in fact may not even be conductive. The tips of the contacts 4500 and 4600 may also be angled, so that they are unlikely to become dislodged in the event of shock or vibration. Exemplary embodiments of such angled contacts are described in greater detail in U.S. patent application Ser. No. 11/263,912, incorporated by reference in its entirety.

As described above, an electrical signal which is input (or output) to the signal via 4160 may be transmitted to the stationary contact 4600. The signal path is from the via 4160 down the passive beam 4100 to the moving contact 4500, across the junction to the stationary contact 4600 to an output (or input) signal via under the stationary contact. Since the signal must travel down the relatively long, passive beam 4100 to the junction, there may be some undesirable signal loss along this path. To reduce this loss through the switch, the MEMS hysteretic thermal actuator 4000 may instead be used to provide a shunt path between two stationary contacts on the surface of the substrate. In this case, a shunt feature 6100 may be disposed on the distal end of the MEMS hysteretic thermal actuator 4000 to provide the electrical connection between the two stationary electrodes. Since these electrodes may both be made of a low resistivity gold or a gold alloy, the insertion loss of such a switch may be lower than the embodiment shown in FIG. 18.

Figure 25:
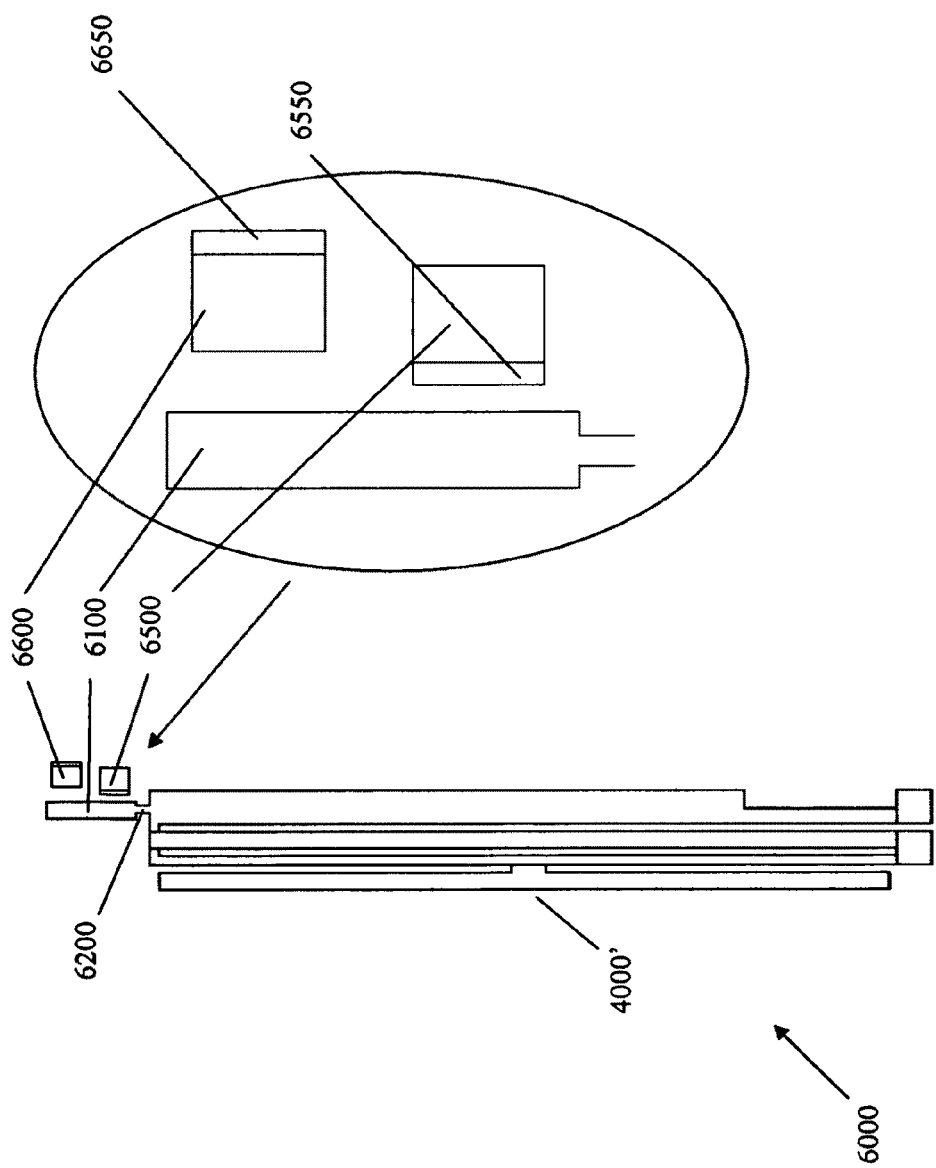
FIG. 25 is an embodiment of an electrical switch using a shunt bar disposed on the distal ends of a MEMS hysteretic thermal actuator.

Such an embodiment is shown in FIG. 25. The shunt switch 6000 employs a MEMS hysteretic thermal actuator 4000' very similar to MEMS hysteretic thermal actuator 4000, except that instead of a moving contact 4500, there is a moving shunt bar 6100, which may provide a low resistance path between two stationary contacts 6500 and 6600 disposed on the surface of the substrate.

Figure 26B:
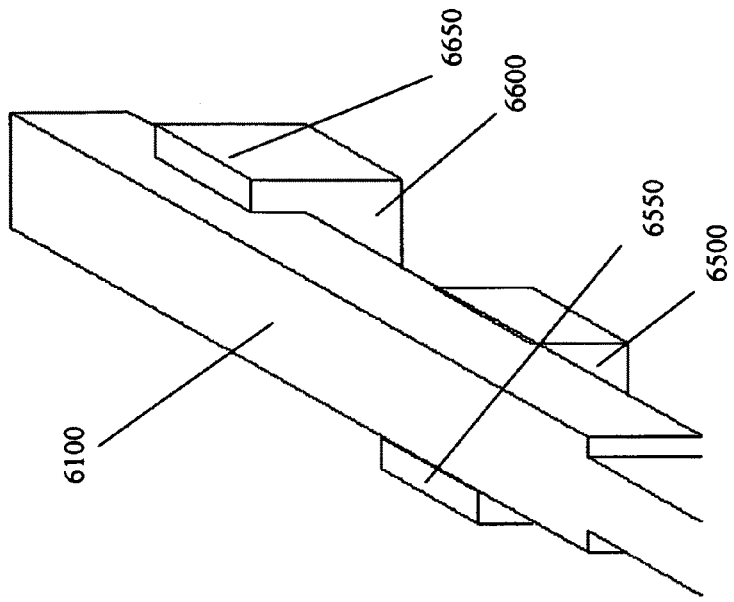
FIG. 26b is an illustration showing further detail of the shunt bar and contacts of the switch shown in FIG. 25, in the closed position.
Figure 26A:
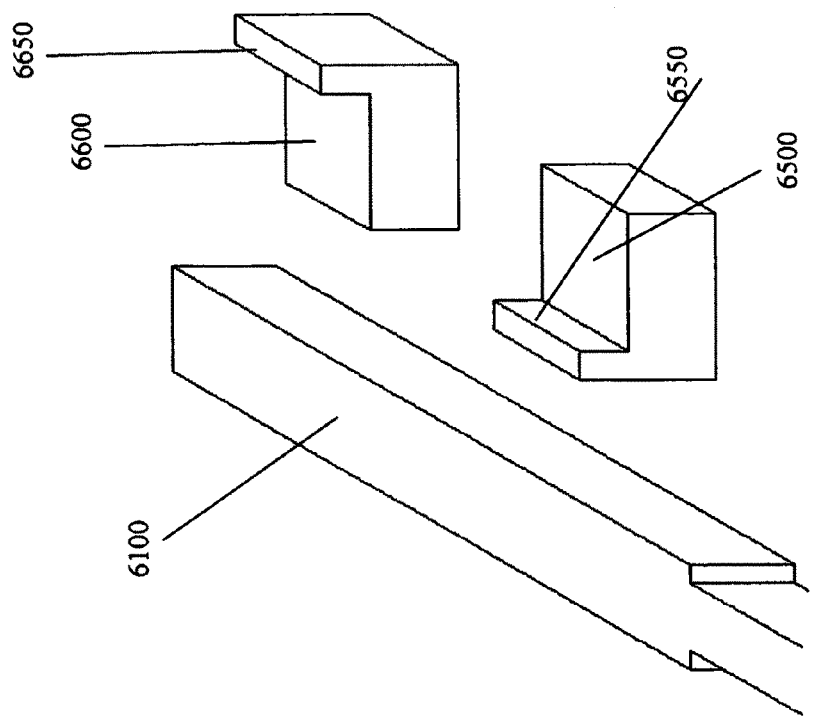
FIG. 26a is an illustration showing further detail of the shunt bar and contacts of the switch shown in FIG. 25, in the open position.

The stationary contacts 6500 and 6600 may each have tips 6550 and 6650, respectively, which restrict the motion of the shunt bar 6100. These features are more clearly shown in the perspective views of FIGS. 26a and 26b. As with the previous embodiment, the contacts 6500 and 6600 may be formed of gold or a gold alloy, the resistance of the electrical switch junction may be quite low. The shunt bar 6100 may be made of the same material as the MEMS hysteretic thermal actuator 4000', and may thus be nickel or a nickel-manganese alloy. The shunt bar 6100 may be about 50 µm long, 20 µm wide and 10 µm thick. The distance between the tips may be about 22 µm, allowing the 20 µm shunt bar a slip fit between the tips of the contacts 6500 and 6600, as shown in FIG. 26a.

A heating element (not shown) may be disposed beneath the MEMS hysteretic thermal actuator 6000, similarly to heating element 5000 which heats MEMS hysteretic thermal actuator 4000. The heating element heats a heat fin, an in-plane drive beam, and an out-of-plane drive beam included in MEMS hysteretic thermal actuator 4000'. As with MEMS hysteretic thermal actuator 4000, this causes the tip of the actuator 4000' carrying shunt bar 6100 to be lifted up and over the tip 6550 of the stationary contact 6500. The shunt bar 6100 then settles between the tips 6550 ad 6650, upon cessation of the drive current to the heating element 5000, as shown in FIG. 26b.

Figure 27:
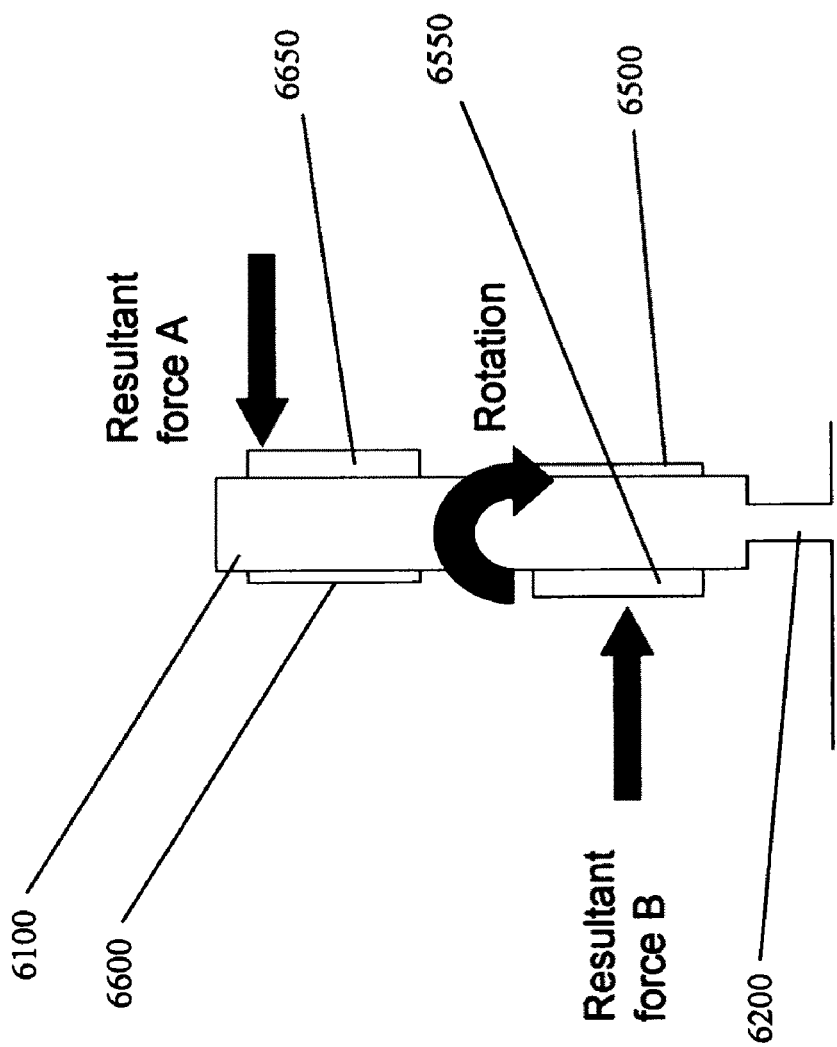
FIG. 27 shows further detail of the forces involved in the switch using a shunt bar, when the switch is closed.

After cessation of the drive current, the stiffness of MEMS hysteretic thermal actuator 4000' tends to try to restore the actuator 6000 to its original position. This restoring force tends to rotate the shunt bar resting between the stationary tips 6550 and 6650. This rotation forces the shunt bar against the tips of the contacts, allowing reliable contact between the shunt bar 6100 and the tips 6550 and 6650, thus closing the switch, as shown in FIG. 27.

Since the MEMS hysteretic actuator 4000 functions as a latchable device with motion hysteresis, it may be applied to any of a number of situations which can make use of such an actuator. FIG. 28 shows such an alternative embodiment, that of a variable optical attenuator 7000 using MEMS hysteretic thermal actuator 4000.

The variable optical attenuator (VOA) 7000 may be configured to interact with, for example, a laser beam 8000 propagating in a plane substantially parallel to the surface of the substrate. A shutter 7100 may be disposed at or near the tip of the MEMS hysteretic thermal actuator 4000. When the device is activated, this shutter 7100 may be configured to extend into the laser beam 8000, thus blocking a portion of the beam from arriving at a downstream optical element. The blocking may occur upon supplying current to a heating element (not shown) disposed beneath the MEMS hysteretic thermal actuator 4000, in a configuration similar to that shown in FIGS. 16*a* and 16*b*.

Figures 29A, 29B:
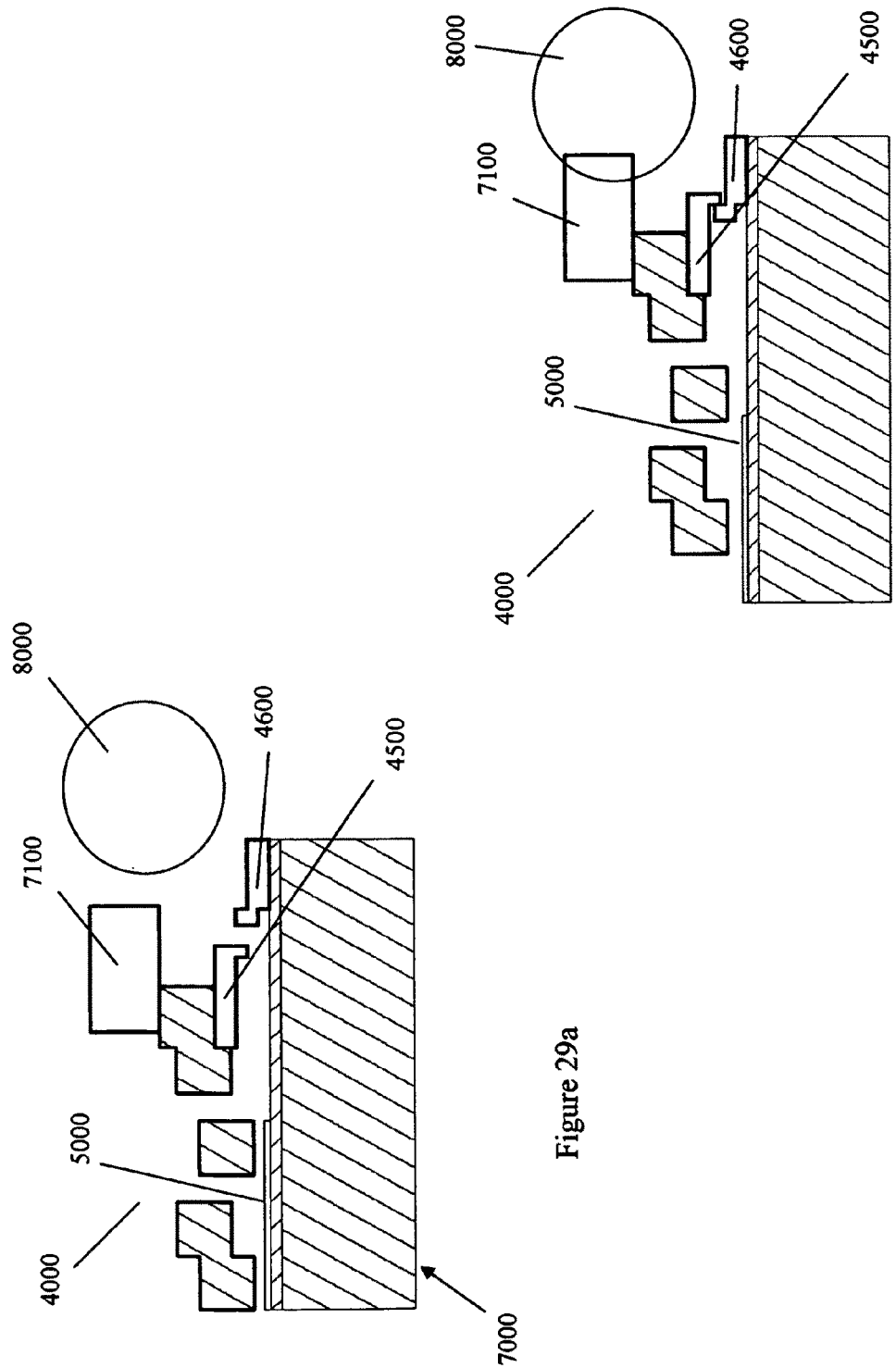
FIG. 29a illustrates the operation of the variable optical attenuator in the retracted position.
FIG. 29b illustrates the operation of the variable optical attenuator in the extended position.

The VOA 7000 is shown in cross section in FIGS. 29*a* and 29*b*. In FIG. 29*a*, the MEMS hysteretic thermal actuator 4000 is in the quiescent, retracted position, and the shutter 7100 does not interfere with the laser beam 8000. In FIG. 29*b*, a heating element (not shown) disposed underneath causes MEMS hysteretic thermal actuator 4000 to bend to a position in which the shutter intercepts at least a portion of the laser beam 8000. The VOA 7000 may be latched in this position by the tips of the contacts 4500 and 4600.

It should be understood that the VOA 7000 shown in FIGS. 28-29 is exemplary only, and that other configurations of the device are possible using the MEMS hysteretic thermal actuator 4000. For example, by disposing the shutter 7100 orthogonally off the tip of the MEMS hysteretic thermal actuator 4000, a VOA may be formed to interact with a laser beam propagating in the orthogonal direction, i.e. perpendicular to the plane of the paper.

Figure 30:
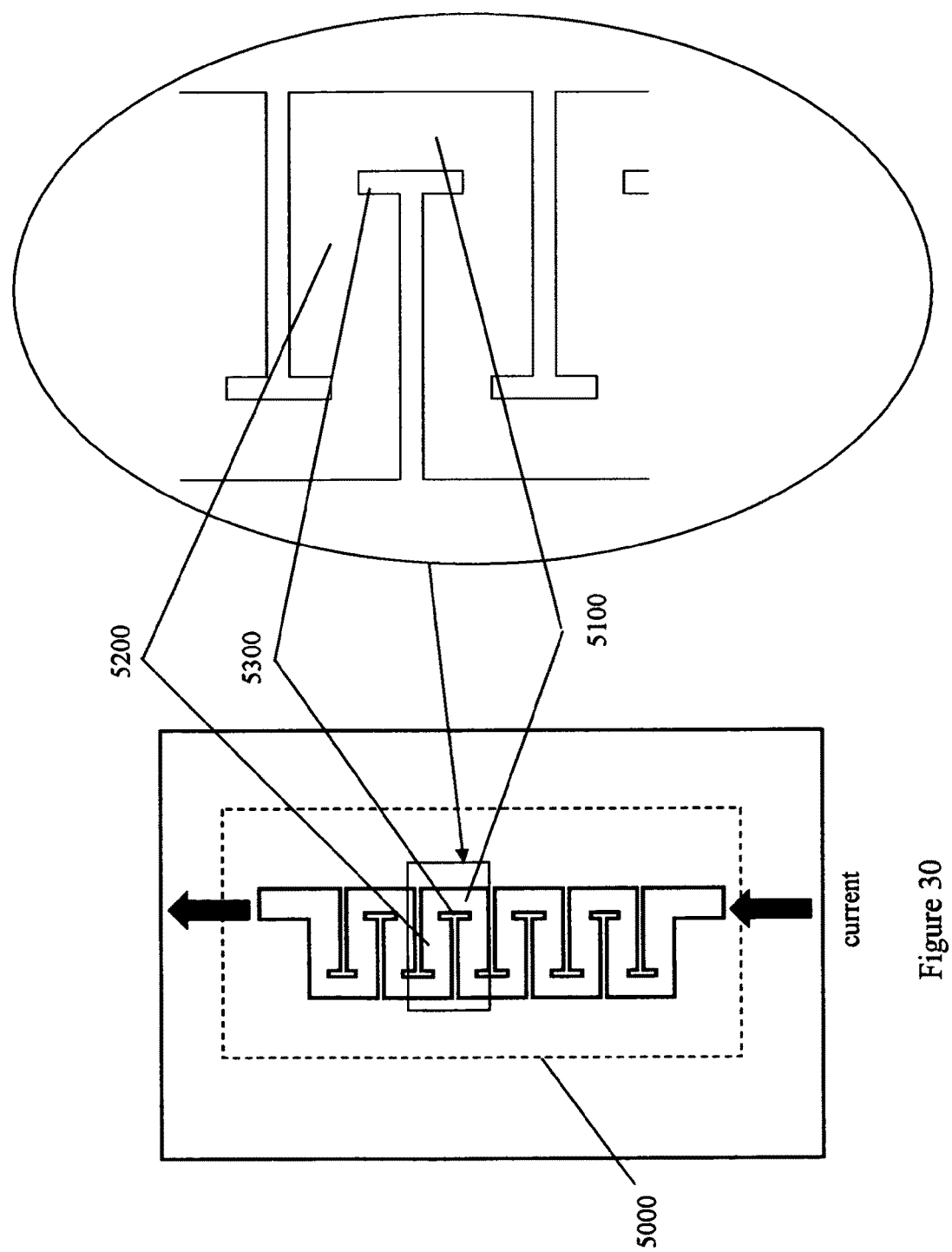
FIG. 30 shows additional detail of the heating element of the MEMS hysteretic thermal actuator.

The predictable, stable operation of an electrical switch using MEMS thermal actuator 4000 may depend on proper design and implementation of the heating element 5000. The heating element may be formed over an insulating layer, which keeps the current confined to the heating element. While heating elements based on joule heating are known, the temperature reached by the heating element may be increased by lengthening the heating element, thus raising its overall resistance. However, since the heating element expands as it heats, it may produce a substantial amount of strain which may be transmitted to the surface below it, which may cause delamination or breakage of the heating element or the insulating layer beneath it. Thus, while lengthening the heating element may raise the temperature it achieves, it may pose more reliability problems for the heating element 5000. This problem may be relieved by forming the heating element in a serpentine pattern, which reduces the total length of each leg of the serpentine, thus reducing the strain and stress produced. To minimize the area under the thermal actuator not covered by the heating element, the serpentine may be made with square corners as shown in FIG. 30.

Since the location of the heating element 5000 may be adjacent to and underneath the heat fin 4400, in-plane drive beam 4300 and out-of-plane drive beam 4200, it is important that the heating element not be under the passive beam, which would decrease the efficiency of the switch because the passive beam would then expand as well as the drive beams. Similarly, heat generated to the left beyond the heat fin 4400 is of no use to the actuator, as it is not efficiently absorbed by the actuator elements. Thus, the location of the heating element may be restricted to the area directly beneath the heat fin 4400, in-plane drive beam 4300 and out-of-plane drive beam 4200. Accordingly, the most efficient use of this area is to arrange the heating element in a serpentine pattern within this area, in order to increase the length of the heating element and thus its resistance. This arrangement is shown in FIG. 30. In one embodiment, the heating element material is tantalum (Ta), which is deposited to a thickness of about 0.2 μm to about 0.5 μm.

One issue with the serpentine arrangement of the heating element 5000 is that portions 5100 of the heating element that are adjacent to the relatively cold, empty substrate surface may be cooler that areas 5200 of the heating element that are adjacent to other, hot portions of the heating element. Thus, the outer lengths 5100 of the serpentine heating element 5000 may be cooler than the interior lengths 5200. This may result in an unexpected variable trajectory of the tip of the passive beam 4100, as the in-plane drive beam 4300 and out-of-plane drive beams pass over hotter, then cooler areas of the heating element 5000.

This trajectory non-uniformity can be reduced by providing "T"-shaped voids 5300 which define the interior angles between the different portions of the heating element 5000. By moving the location of this T-shaped void to the right or the left either narrows or widens portion 5100 while lengthening or shortening portion 5200. By shifting the T-shaped void to the right, portion 5100 is narrowed, causing its resistance to go up, which raises its temperature in this portion. Similarly, widening the T-shaped void may shorten the inner portion 5200, raising its temperature. Thus, the design of the T-shaped void 5300 may be adjusted to achieve a relatively uniform temperature profile along and across the serpentine heating element 5000.

The MEMS hysteretic thermal actuator may be activated, therefore, by applying current to the serpentine heating element 5000. The heating element reaches thermal equilibrium quickly. Within about 1 μsec, the heating element 5000 reaches an operating temperature of about 400 C. upon receiving an input current of 180 mA. As described above, this heat is transferred to the heat fin 4400, the in-plane, narrow drive beam 4300, and the wider, out-of-plane drive beam 4200, nearly simultaneously, until the out-of-plane beam 4200 moves off the heating element. This heating drives the passive beam 4100 up and to the right as was shown in FIGS. 20*a*-20*d*. Upon cessation of the drive current, the heating element cools quickly through the thermal ground of the through wafer via 4160. Thus, the out-of-plane drive beam 4200 cools first, followed by the narrower, in-plane drive beam 4300 and the heat fin 4400. Since the heat fin 4400 is thermally isolated, it takes the longest time to cool, and thus the hysteresis of the MEMS thermal actuator 4000 is achieved.

FIGS. 31-40 illustrate an exemplary method for manufacturing the MEMS hysteretic thermal actuator 4000 and heating element 5000. The MEMS hysteretic thermal actuator 4000 and heating element 5000 may be fabricated on any suitable substrate, such as a metal, glass, ceramic, or semiconductor material. In one exemplary embodiment, the MEMS hysteretic thermal device 4000 and heating element 5000 may be formed on a silicon substrate, which may conveniently be provided with an insulating layer 4010 over the substrate. This insulating layer 4010 may be a layer of thermally grown silicon dioxide $SiO_2$ with a thickness of at least a few microns. Methods for forming the thermal oxide are well known in the art, and so are not described further here.

The substrate 4700 may be prepared with at least one through wafer via 4160. Methods for preparing the substrate and forming the through wafer via 4160 are described in greater detail in U.S. Pat. No. 7,233,048 and U.S. patent application Ser. No. 11/482,944, incorporated by reference herein in their entireties. Although not shown in FIG. 32, the through wafer via 4160 may be surrounded by an insulating layer, to prohibit the signal or current flowing through the through wafer via form shorting to the conductive substrate 4700.

Although the through wafer via 4160 is shown in FIGS. 31-40, it should be understood that the vias may not extend completely through the substrate during fabrication of the MEMS hysteretic thermal actuator 4000. In this case, additional wafer material may exist underneath that shown in FIGS. 31-40, which gives the structure sufficient mechanical strength to be handled during the processing. This additional material may be removed at the end of the processing, as described in the incorporated '048 and '944 applications, or after encapsulation with the lid wafer, as described further below. For ease of depiction however, the through wafer vias are shown in FIGS. 31-40 in their completed form, extending completely through the substrate 4700.

Figure 31:
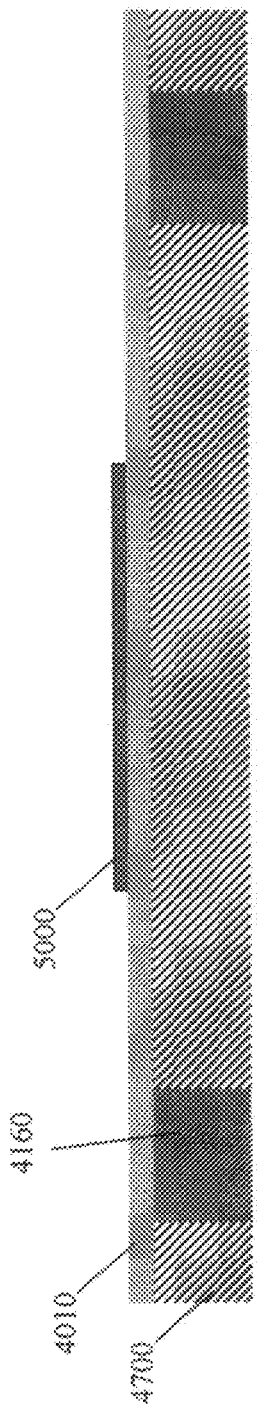

After formation of the through wafer via 4160 and the insulating layer 4010, a layer of thermal material may be deposited on the substrate 4700. The thermal material may be a conductive material with a finite resistance, which heats by joule heating when current flows through the thermal material. The thermal material may be tantalum (Ta) deposited to a thickness of about 0.2 to about 0.5 μm thick to form the heating element 5000. The shape of the heating element 5000, in plan view, may be similar to that shown in FIG. 30. The condition of the substrate 4700 after deposition of the heating element 5000 is shown in FIG. 31. The serpentine pattern, as well as the T-shaped corners, may be formed by etching voids in a deposited tantalum layer, or by depositing the tantalum in the desired shape through, for example, a stencil. The tantalum layer may be formed by electroplating or sputtering, for example.

Figure 32:
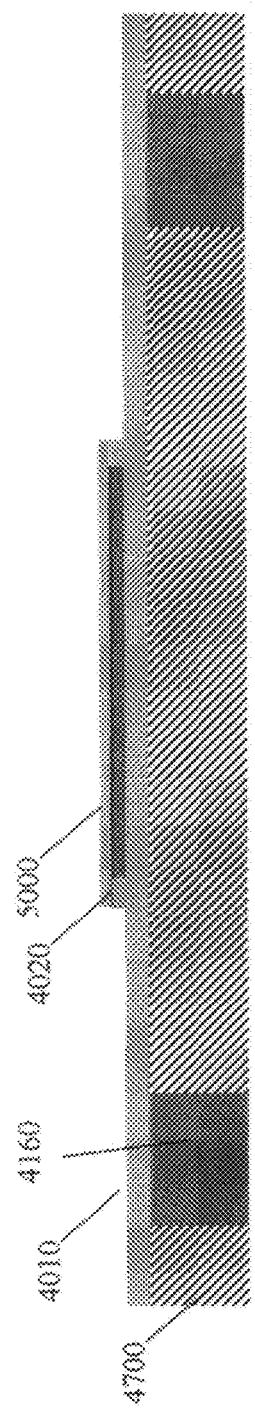

The heating element 5000 and substrate 4700 may then be covered by another layer 4020 of insulating material, to protect the heating element 5000 from shorting to any other features of the MEMS hysteretic thermal actuator 4000. The insulating layer 4020 may be, for example, sputtered silicon dioxide, and is shown in FIG. 32.

Figure 33:
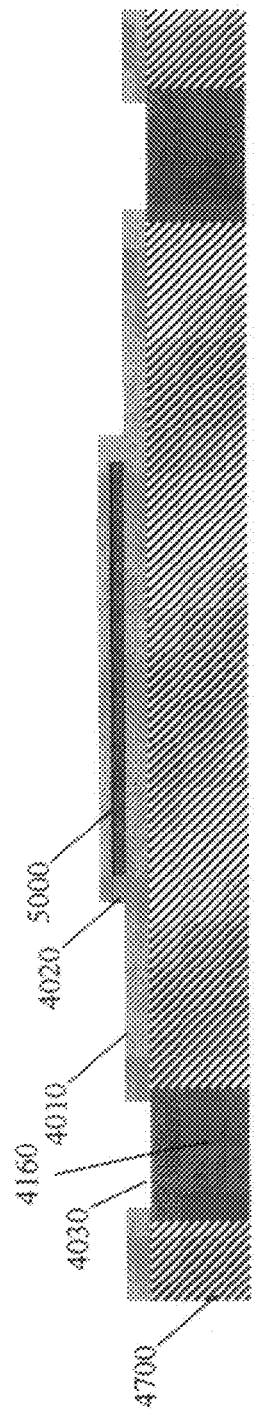

Because the insulating layer 4010 may be deposited unpatterned, over the whole surface of the substrate 4700, the insulating layer 4010 may need to be removed in an area 4030 directly above the via 4160, to provide electrical access to the via 4160. This may be done by milling or etching away the material of the insulating layer 4010 at this location 4030. The condition of the substrate is as shown in FIG. 33.

A sacrificial layer 4040 may then be applied over the second insulating layer 4030, which may form a platform on which the beams 4000 will later be deposited. This sacrificial layer may be any material which may subsequently be removed in an etching process. In one exemplary embodiment, the sacrificial layer may be copper (Cu), about 2 μm thick, and deposited by electroplating. Since the materials and processes for electroplating and subsequently etching copper are well known in the art, they are not set forth further herein. The condition of the substrate with the copper layer 4040 is shown in FIG. 34.

Additional sacrificial features 4050 may then be formed or deposited over the copper sacrificial layer 4040, as shown in FIG. 35. These features may provide a structure for the formation of the tips of the contacts 4500 and 4600. The contact material will subsequently be formed or electroplated over these additional sacrificial features 4050, whereupon the additional sacrificial features 4050 may be removed. These additional sacrificial features 4050 may be made of an epoxy-based polymeric photoresist, for example, or any other material of sufficient mechanical rigidity, which may be easily removed when no longer needed.

The moving contact 4500 and stationary contact 4600 may then be formed over the additional sacrificial features 4050. The moving contact 4500 and stationary contact may both be formed of the same material, or they may be formed from different materials. In one exemplary embodiment, the moving contact 4500 and stationary contact 4600 are formed by electroplating gold or a gold alloy such as gold-palladium over the additional sacrificial features 4050. Additional details for the deposition of a gold-palladium alloy as a contact material may be found in U.S. patent application Ser. No. 11/785,119, incorporated by reference herein in its entirety. The condition of the substrate after formation of the contacts 4500 and 4600 is shown in FIG. 36. Other materials may be used for the contacts, including palladium, gold, a gold-cobalt alloy, ruthenium, platinum, a gold-platinum alloy, and gold-nickel alloy, for example.

A second sacrificial copper layer 4060 may then be formed over portions of the first sacrificial 4040 as illustrated in FIG. 37. This copper sacrificial layer 4060 may be about 4 μm thick, and may be formed using techniques similar or identical to those used to form the first sacrificial layer 4040. The contours of this second sacrificial layer will determine the contour of the drive beams 4300 and passive beam 4100, which will be deposited directly on top of this sacrificial layer 4060.

The heat fin 4400 and out-of-plane drive beam 4200 are formed over the first sacrificial layer 4040. These beams are both indicated by reference number 4070 in FIG. 38. Thus the entire beam structure 4100 is formed of a single material, and deposited in the same step, by depositing layer 4070 over the surface. This leads to substantial process simplification compared to MEMS hysteretic thermal actuator 3000, shown in FIG. 15, and described in U.S. patent application Ser. No. 11/705,738, incorporated by reference in its entirety. The single material may be nickel or an alloy of nickel and manganese. The NiMn alloy may have significant mechanical stability advantages over the pure nickel material. The NiMn alloy may be electroplated to a thickness of about 10 μm. Details as to a method and apparatus for electroplating this material may be found in U.S. patent application Ser. No. 11/386,733, incorporated by reference in its entirety. This step forms both the beams 4100-4400 as well as the anchor points 4150 and 4250. The material deposited in this step also couples the beams 4100-4300 together at their distal ends.

After formation of the drive beams and passive beam, it only remains to remove the sacrificial layers 4040, 4050 and 4060. This may require two different etching steps for the two different materials. If the sacrificial materials are all the same, they may be removed at the same time. The copper sacrificial layers 4040 and 4060 may be removed with an isotropic etch using an ammonia-based Cu etchant as is well known in the art. The condition of the substrate after removal of the copper sacrificial layers 4040 and 4060 is shown in FIG. 39. The additional sacrificial features 4050 which may have been an epoxy-based photoresist, may be removed by simply dissolving the photoresist in the appropriate solvent. The MEMS hysteretic thermal actuator 4000 is now essentially complete, as shown in FIG. 40.

As is typical in the MEMS and semiconductor IC art, many similar or identical MEMS hysteretic thermal actuators 4000 may be fabricated on a single substrate 4700. For simplicity, only a single device is shown in the preceding figures. Each of these devices may be encapsulated with a cap or lid. This lid may be another wafer affixed to the substrate 4700 with a bonding agent or adhesive, which may or may not form a hermetic barrier to the passage of gases. Examples of suitable adhesives may be a ceramic or glass frit material. Details as to the implementation of a glass frit seal may be found in U.S. patent application Ser. No. 11/390,085 and U.S. patent application Ser. No. 11/896,648, incorporated by reference in their entireties. If a lower temperature adhesive is required, a metal or metal alloy seal may be used, as described in, for example, U.S. patent application Ser. No. 11/211,622 and U.S. patent application Ser. No. 11/304,601, incorporated by reference in their entireties. If desired, the device cavity formed between the lid wafer and the substrate 4700 may be filled with a preferred gas environment, such as an insulating gas such as $SF_6$, for example, while in a wafer bonding chamber. After bonding in a bonding chamber, the substrate and lid wafer pair may be singulated, to separate each of the plurality of encapsulated devices from the others. The singulation may be accomplished by sawing or scribing along the bond lines between the devices.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. For example, while MEMS hysteretic thermal actuators are described which have three beams, it should be understood that any number of additional beams may also be used. In addition, although the drive beams are shown to the left of the passive signal beam, such that the signal beam is driven generally to the right, it should be understood that the drive beams may also be placed to the right of the passive signal, and thus generally drive the signal beam to the left. Furthermore, while the embodiments described above relate to a microelectromechanical switch, it should be understood that the techniques and designs described above may be applied to any of a number of other microelectromechanical devices, such as valves, pistons, sensors or optical devices. Accordingly, the exemplary implementations set forth above, are intended to be illustrative, not limiting.

What is claimed is:

1. A hysteretic micromechanical device formed on a surface of a substrate, comprising:
    a heating element disposed on the surface of the substrate;
    a plurality of beams formed each with their neutral axes substantially in one of a plurality of planes parallel to the surface of the substrate and anchored at their proximal ends to the substrate by at least one anchor point, wherein the plurality of beams is coupled one to another at or near their distal ends, and wherein the plurality of beams is configured to move in a trajectory that is neither parallel to nor perpendicular to the surface of the substrate, when heated by the heating element.

2. The hysteretic micromechanical device of claim 1, further comprising a passive beam disposed with its neutral axis in a first plane substantially parallel to the surface of the substrate in its undeflected state and coupled to the plurality of beams at or near its distal end, wherein the passive beam is driven by the plurality of beams in a trajectory that is substantially different during a heating phase than during a cooling phase of the plurality of beams.

3. The hysteretic micromechanical device of claim 2, wherein
    a first of the plurality of beams is formed with a neutral axis substantially in the first plane; and
    a second of the plurality of beams is formed with a neutral axis substantially in a second plane, wherein the second plane is closer to the surface of the substrate than the first plane.

4. The hysteretic micromechanical device of claim 3, further comprising a heat fin disposed substantially over the heating element and coupled to the first of the plurality of beams, and wherein the first of the plurality of beams is coupled to the second of the plurality of beams at or near its distal end, and wherein the second of the plurality of beams is coupled to the passive beam at or near its distal end.

5. The hysteretic micromechanical device of claim 4, wherein the first and second of the plurality of beams, the heat fin, the passive beam, and the distal ends which couple the beams are all formed of substantially the same material.

6. The hysteretic micromechanical device of claim 5, wherein the heating element is disposed in a serpentine pattern on the surface of the substrate.

7. The hysteretic micromechanical device of claim 6, wherein the serpentine pattern includes T-shaped voids which define the interior angles of the serpentine pattern.

8. The hysteretic micromechanical device of claim 2, further comprising a moving contact disposed at or near the distal end of the passive beam, configured to engage a first stationary contact disposed on the surface of the substrate, when the devices is activated.

9. The hysteretic micromechanical device of claim 8, wherein the moving contact and the stationary contact are both electrically conducting, such that the hysteretic micromechanical device switches an electrical signal from an input electrode to an output electrode.

10. The hysteretic micromechanical device of claim 8, wherein a second stationary contact is disposed on the substrate surface, and the moving contact is a shunt bar disposed on a distal end of one of the plurality of beams, configured to form an electrical connection between the first stationary contact and the second stationary contact when the device is activated.

11. The hysteretic micromechanical device of claim 5, wherein the same material comprises at least one of nickel and an alloy of nickel and manganese.

12. The hysteretic micromechanical device of claim 2, wherein the trajectory during the heating phase is at about a 45 degree angle with respect to the surface of the substrate.

13. The hysteretic micromechanical device of claim 2, further comprising:
    a shutter coupled to the passive beam, which interferes with at least a portion of a light beam emitted from a light source, during at least a portion of at least one of the heating phase and the cooling phase.

14. The hysteretic micromechanical device of claim 9, wherein the stationary contact and the moving contact comprise at least one of palladium, gold, a gold-cobalt alloy, a gold-palladium alloy, ruthenium, platinum, gold-platinum alloy, and gold-nickel alloy, and the moving contact is disposed within about 100 μm of the distal end of the passive beam.

* * * * *